(12) United States Patent
Li et al.

(10) Patent No.: US 11,264,380 B2
(45) Date of Patent: Mar. 1, 2022

(54) SEMICONDUCTOR DEVICE AND METHOD OF MANUFACTURING THE SAME

(71) Applicant: TAIWAN SEMICONDUCTOR MANUFACTURING CO., LTD., Hsinchu (TW)

(72) Inventors: Hou-Ju Li, Hsinchu (TW); Chur-Shyang Fu, Hsinchu (TW); Chun-Sheng Liang, Changhua County (TW); Jeng-Ya David Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

(21) Appl. No.: 16/112,943

(22) Filed: Aug. 27, 2018

(65) Prior Publication Data

US 2020/0066718 A1   Feb. 27, 2020

(51) Int. Cl.

| H01L 27/088 | (2006.01) |
|---|---|
| H01L 29/08 | (2006.01) |
| H01L 21/762 | (2006.01) |
| H01L 21/8234 | (2006.01) |
| H01L 21/3105 | (2006.01) |
| H01L 21/3213 | (2006.01) |

(52) U.S. Cl.
CPC .... *H01L 27/0886* (2013.01); *H01L 21/31051* (2013.01); *H01L 21/32133* (2013.01); *H01L 21/76224* (2013.01); *H01L 21/823418* (2013.01); *H01L 21/823431* (2013.01); *H01L 21/823437* (2013.01); *H01L 21/823481* (2013.01); *H01L 29/0847* (2013.01)

(58) Field of Classification Search
CPC ......... H01L 21/31051; H01L 21/32133; H01L 21/76224; H01L 21/823418; H01L 21/823431; H01L 21/823437; H01L 21/823481; H01L 27/0886; H01L 29/0847
See application file for complete search history.

(56) References Cited

U.S. PATENT DOCUMENTS

| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,799,570 | B1* | 10/2017 | Cheng ............. H01L 21/823807 |
| 9,812,363 | B1 | 11/2017 | Liao et al. |
| 9,853,131 | B1* | 12/2017 | Cheng ............. H01L 21/823418 |

(Continued)

*Primary Examiner* — Evren Seven
(74) *Attorney, Agent, or Firm* — McClure, Qualey & Rodack, LLP

(57) ABSTRACT

A semiconductor device includes a substrate, a first active fin, a second active fin, a dummy fin and a first gate structure. The first and the second active fin are on the substrate and extend along a first direction. The dummy fin is disposed between the first active fin and the second active fin, and extends in the first direction. The dummy fin includes a plurality of layers, and each of the layers includes a material different from another layer. The first gate structure crosses over the dummy fin, the first and the second active fins.

20 Claims, 20 Drawing Sheets

(56) References Cited

U.S. PATENT DOCUMENTS

| | | | |
|---|---|---|---|
| 9,859,380 B2 | 1/2018 | Lee et al. | |
| 10,170,595 B2* | 1/2019 | Cheng | H01L 29/0653 |
| 10,205,005 B1* | 2/2019 | Liou | H01L 21/2255 |
| 10,825,735 B2* | 11/2020 | Wang | H01L 21/02205 |
| 2012/0025312 A1* | 2/2012 | Scheiper | H01L 21/823807 |
| | | | 257/347 |
| 2013/0270638 A1* | 10/2013 | Adam | H01L 29/66795 |
| | | | 257/347 |
| 2017/0278928 A1* | 9/2017 | Tung | H01L 21/02634 |
| 2017/0338323 A1* | 11/2017 | Cheng | H01L 21/02236 |
| 2018/0233500 A1* | 8/2018 | Cheng | H01L 29/42392 |
| 2019/0148235 A1* | 5/2019 | Wang | H01L 29/6681 |
| | | | 257/401 |
| 2019/0312124 A1* | 10/2019 | Lee | H01L 29/6681 |
| 2020/0234966 A1* | 7/2020 | Chang | H01L 21/823481 |

* cited by examiner

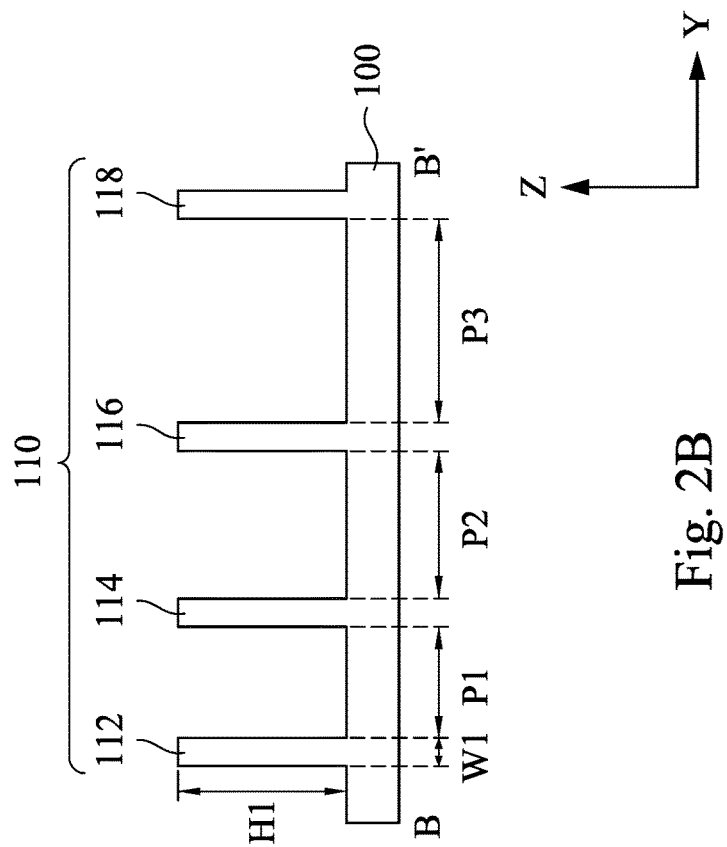
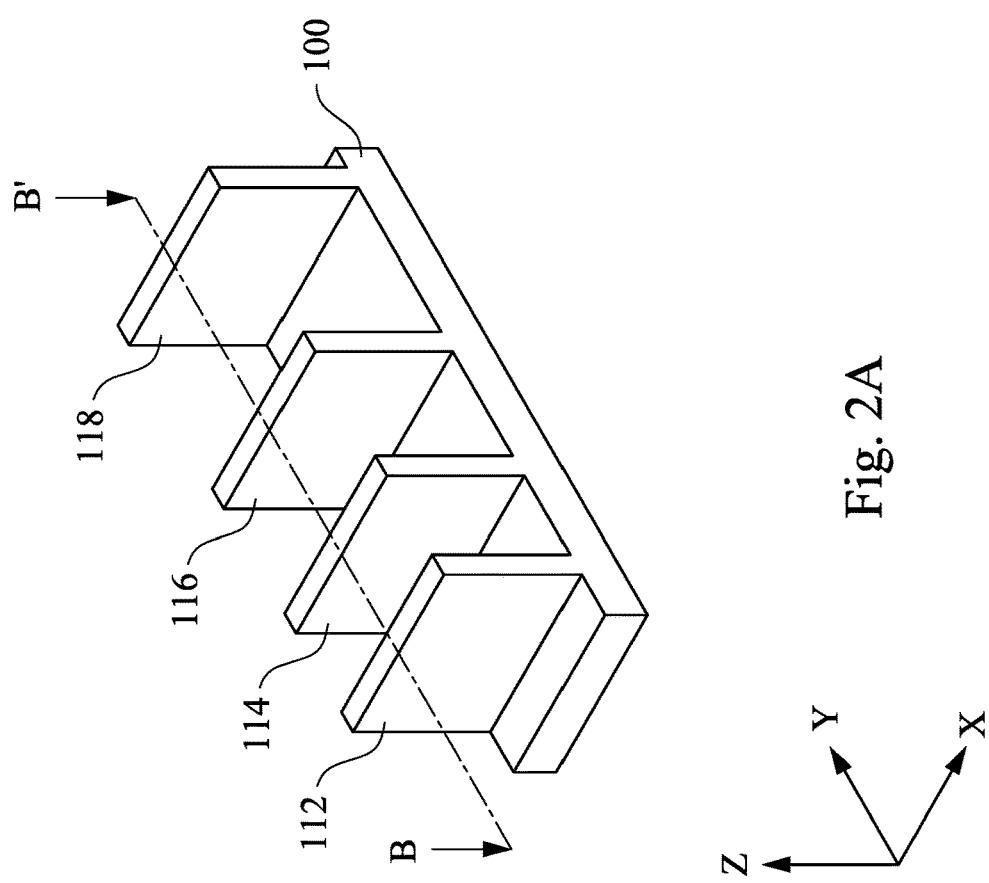
Fig. 2B
Fig. 2A

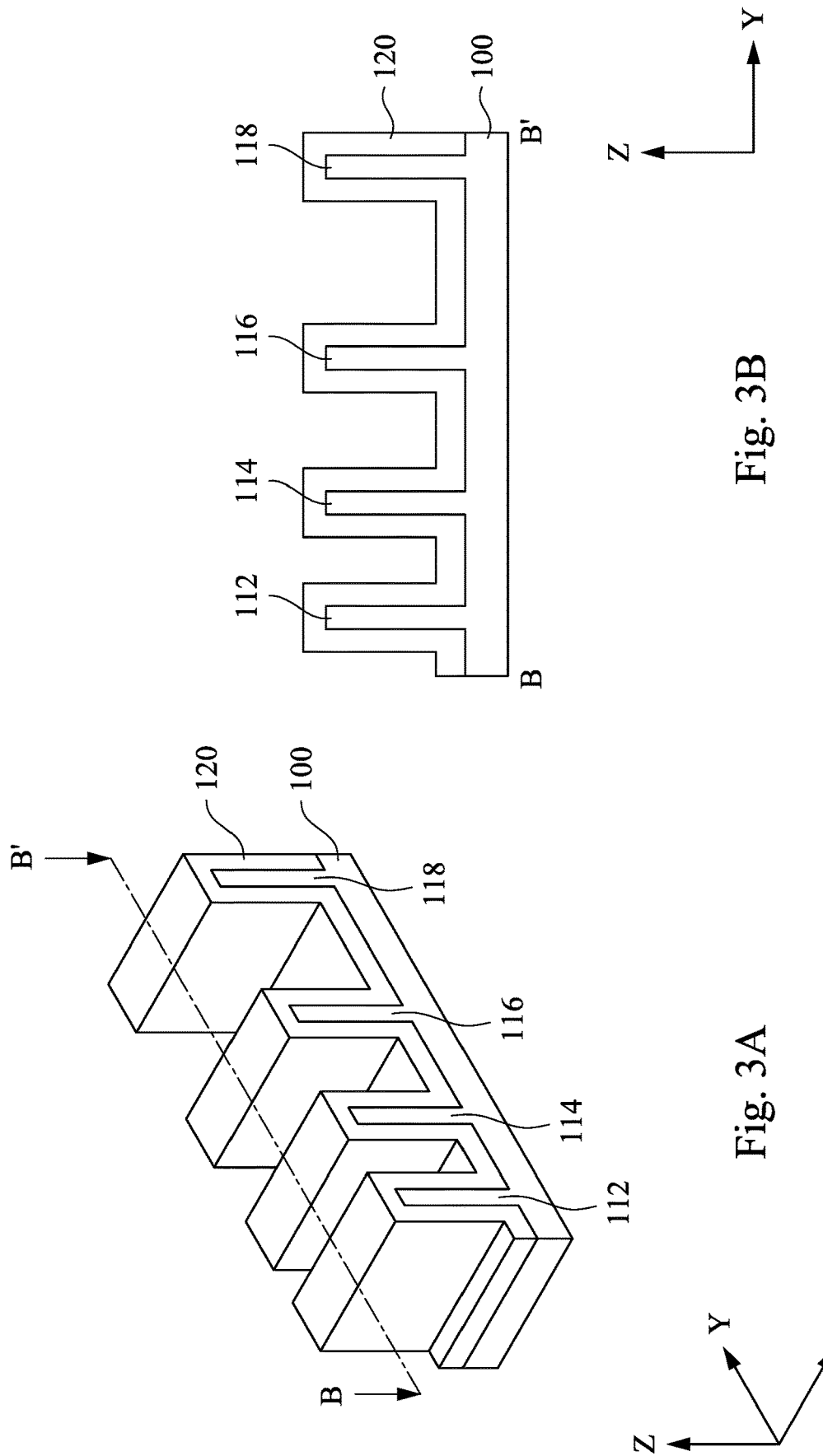

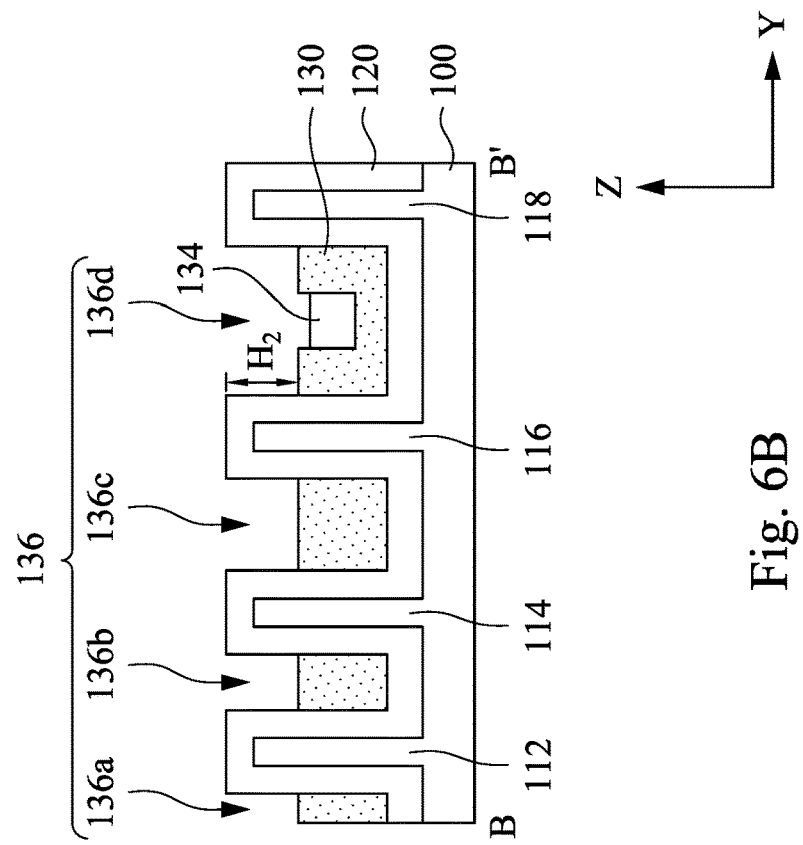
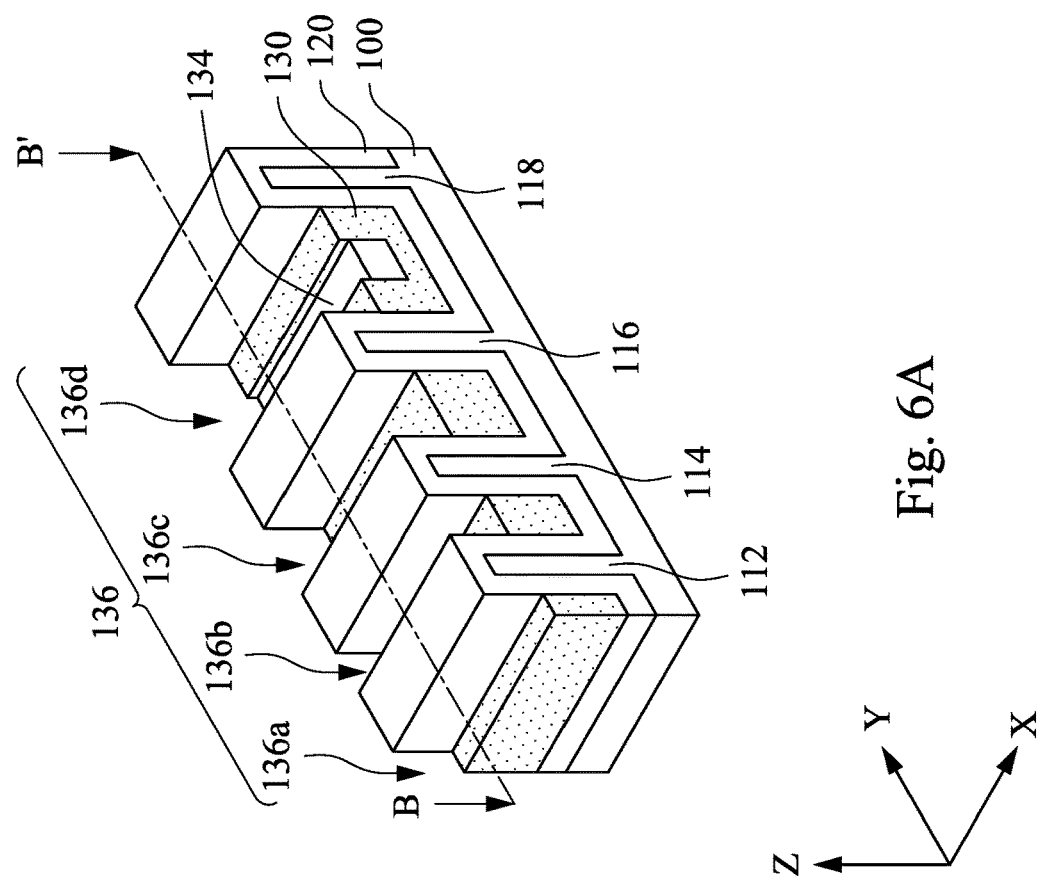
Fig. 6B
Fig. 6A

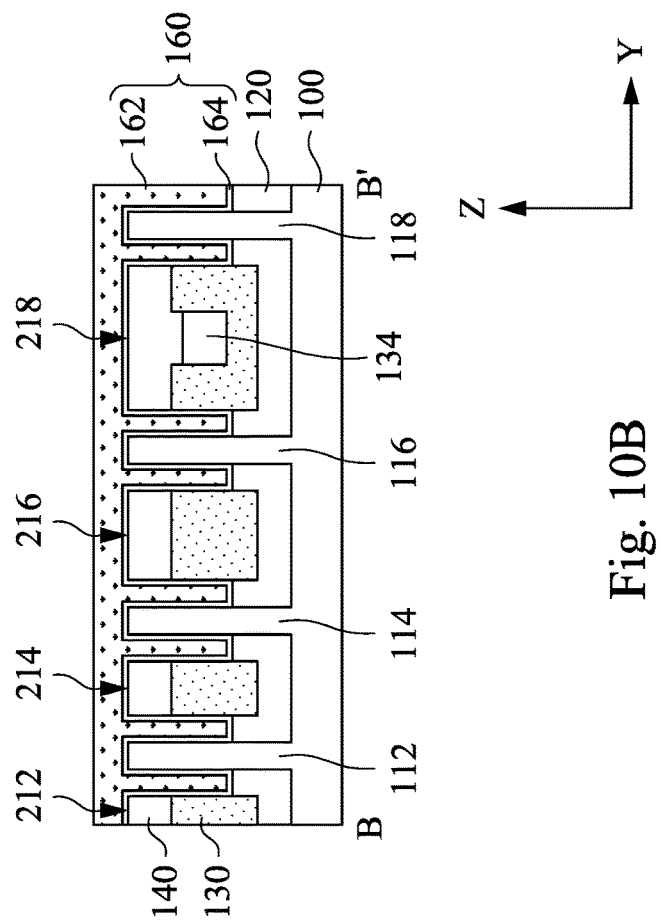
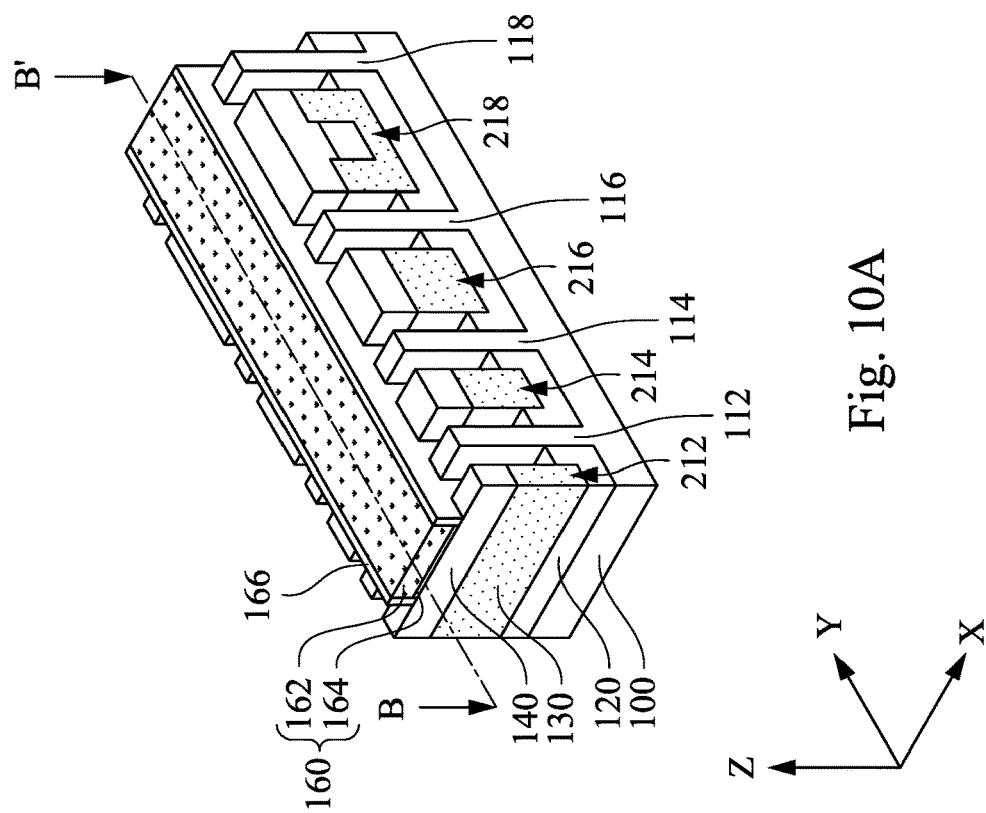
Fig. 10B
Fig. 10A

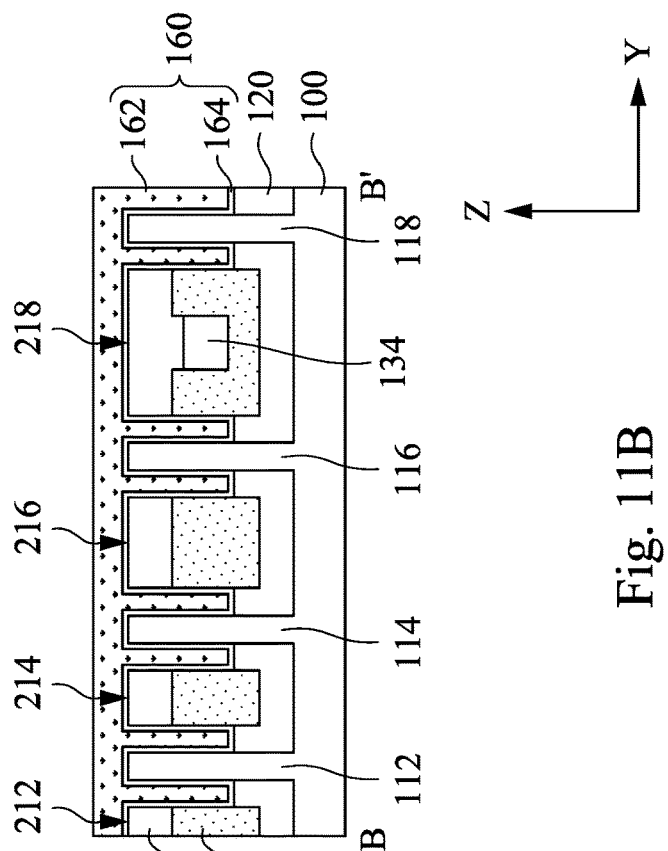
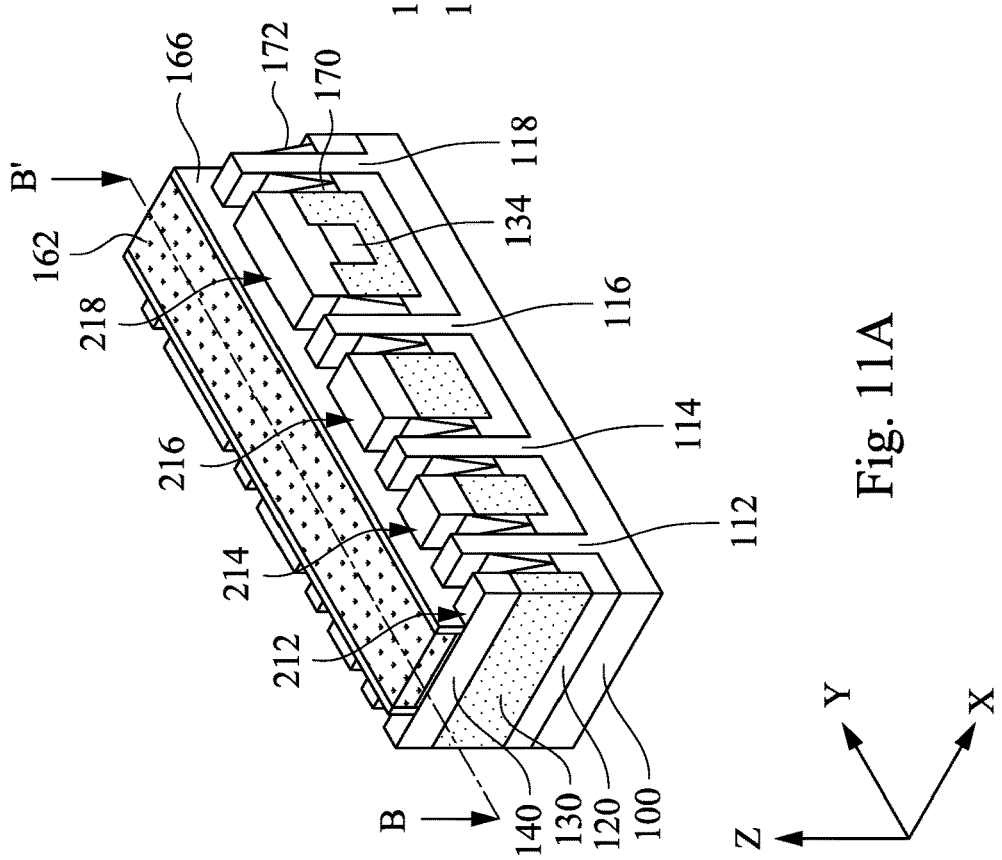
Fig. 11B
Fig. 11A

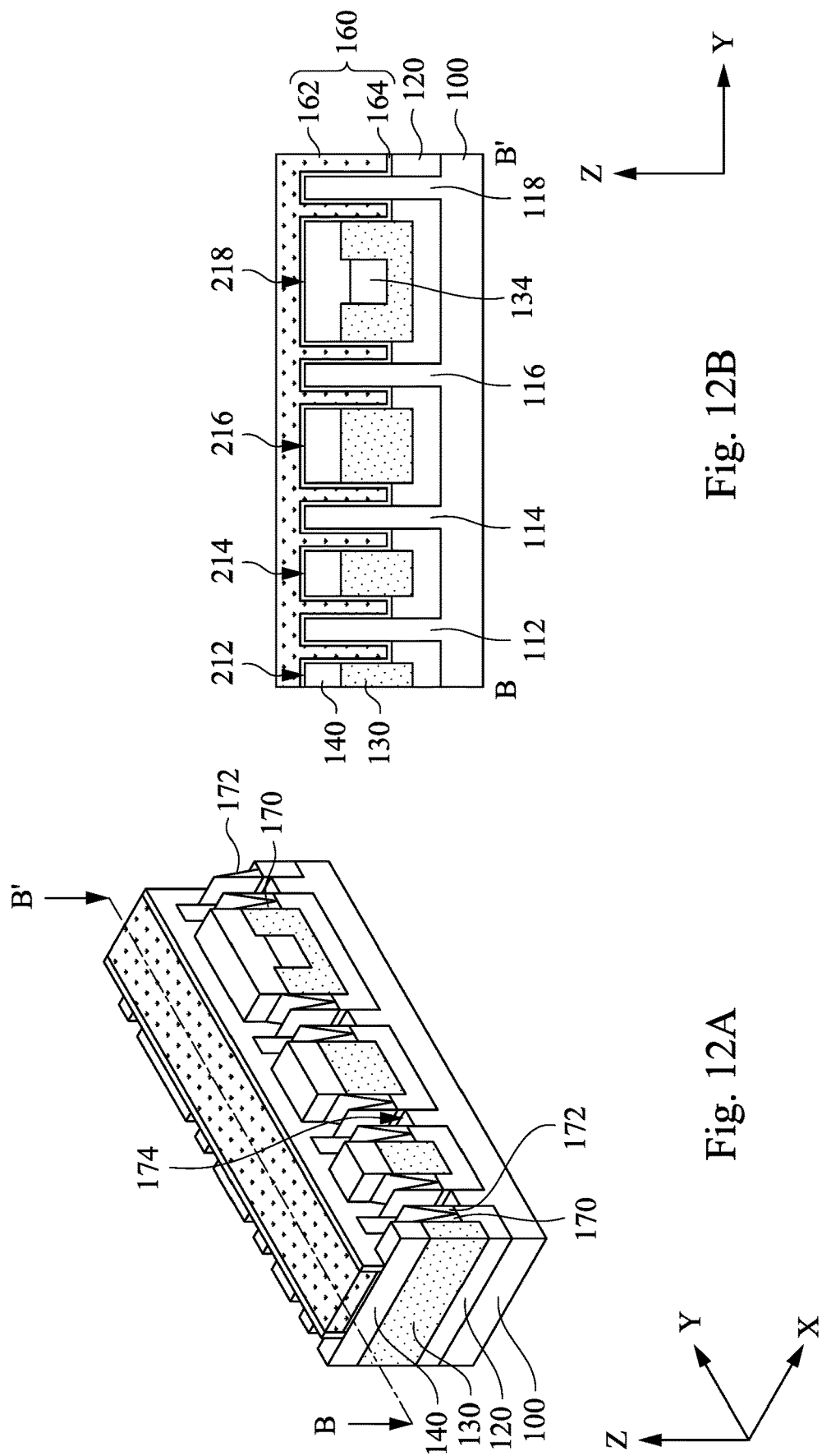

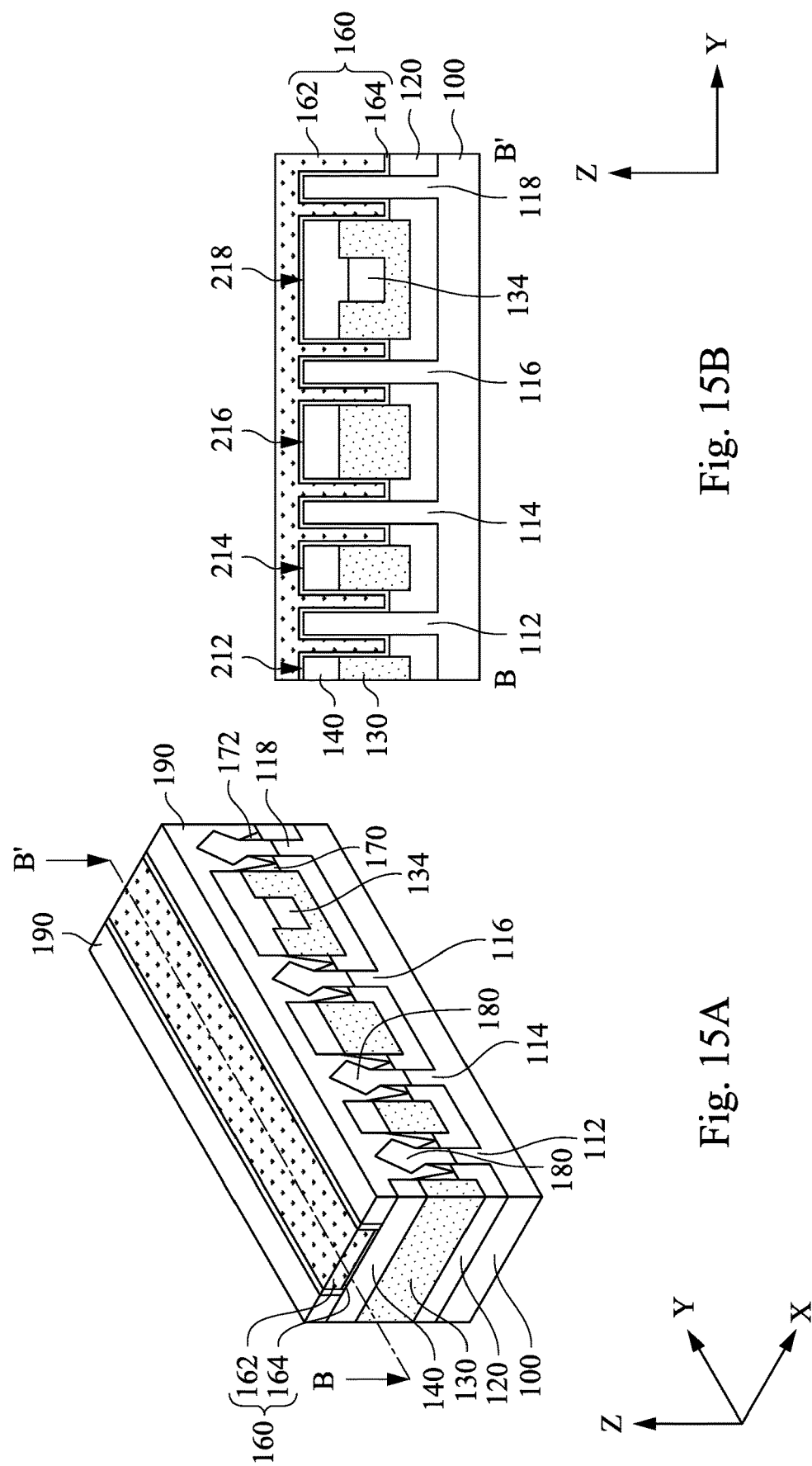

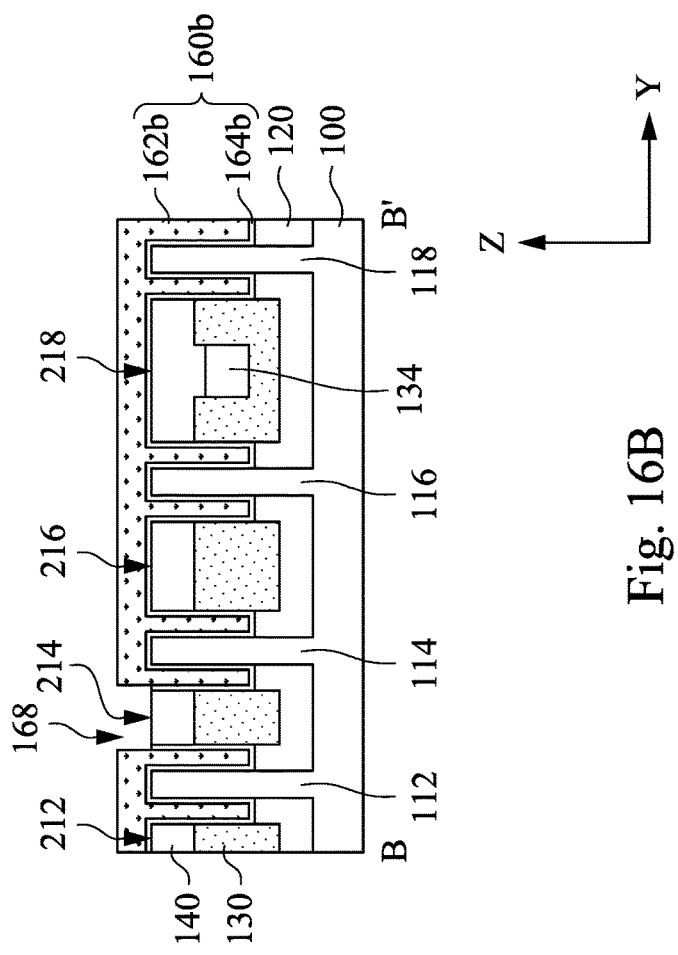
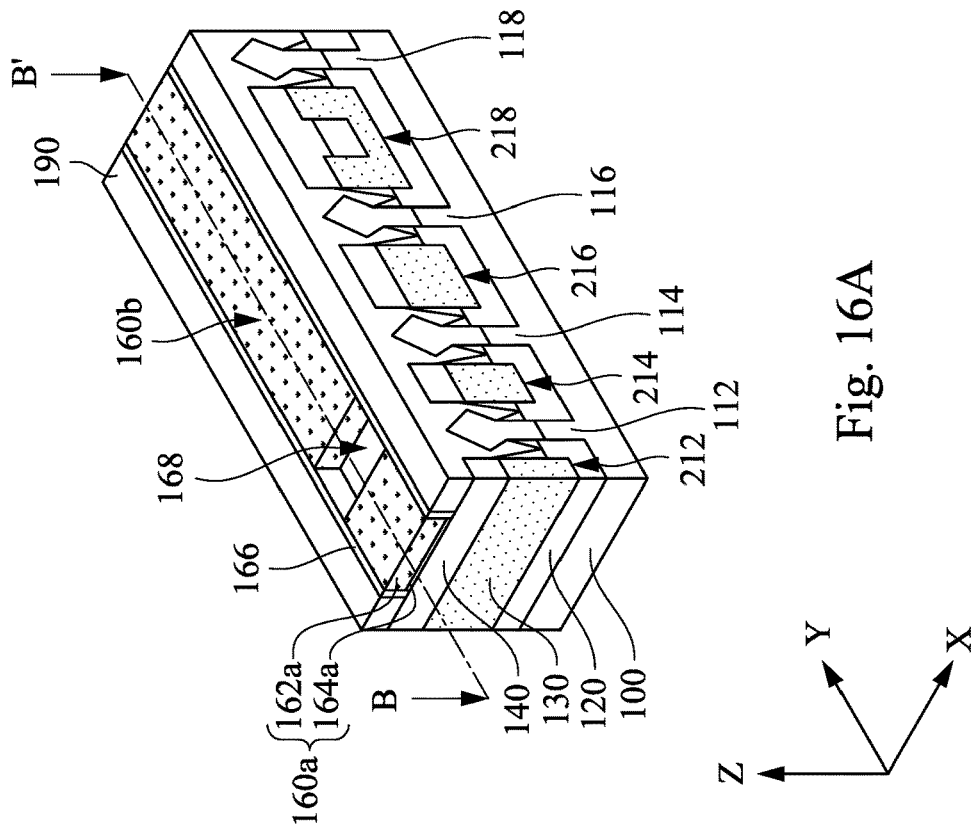
Fig. 16B
Fig. 16A

SEMICONDUCTOR DEVICE AND METHOD OF MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. As the semiconductor industry has strived for higher device density, higher performance, and lower costs, problems involving both fabrication and design have been encountered, therefore leading semiconductor technologies to three-dimensional designs, such as fin-like field effect transistors (FinFETs).

A FinFET includes a thin vertical 'fin' extending on a substrate. The source, drain, and channel regions are defined within this fin. A gate is provided over (e.g., wrapping) the fin. This configuration allows the FinFET devices to have the benefits of reduced leakage current and short-channel effects, as compared to traditional transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A are perspective view of various intermediary stages in the manufacturing of semiconductor device in accordance with some embodiments of the present disclosure.

FIG. 2B, 3B, 4B, 5B, 6B, 7B, 8B, 9B, 10B, 11B, 12B, 13B, 14B, 15B, 16B, 17B-17E, 18B are cross-sectional views of a method for manufacturing a semiconductor device at various stages in accordance with some embodiments of the present disclosure.

DETAILED DESCRIPTION

Figure 1:
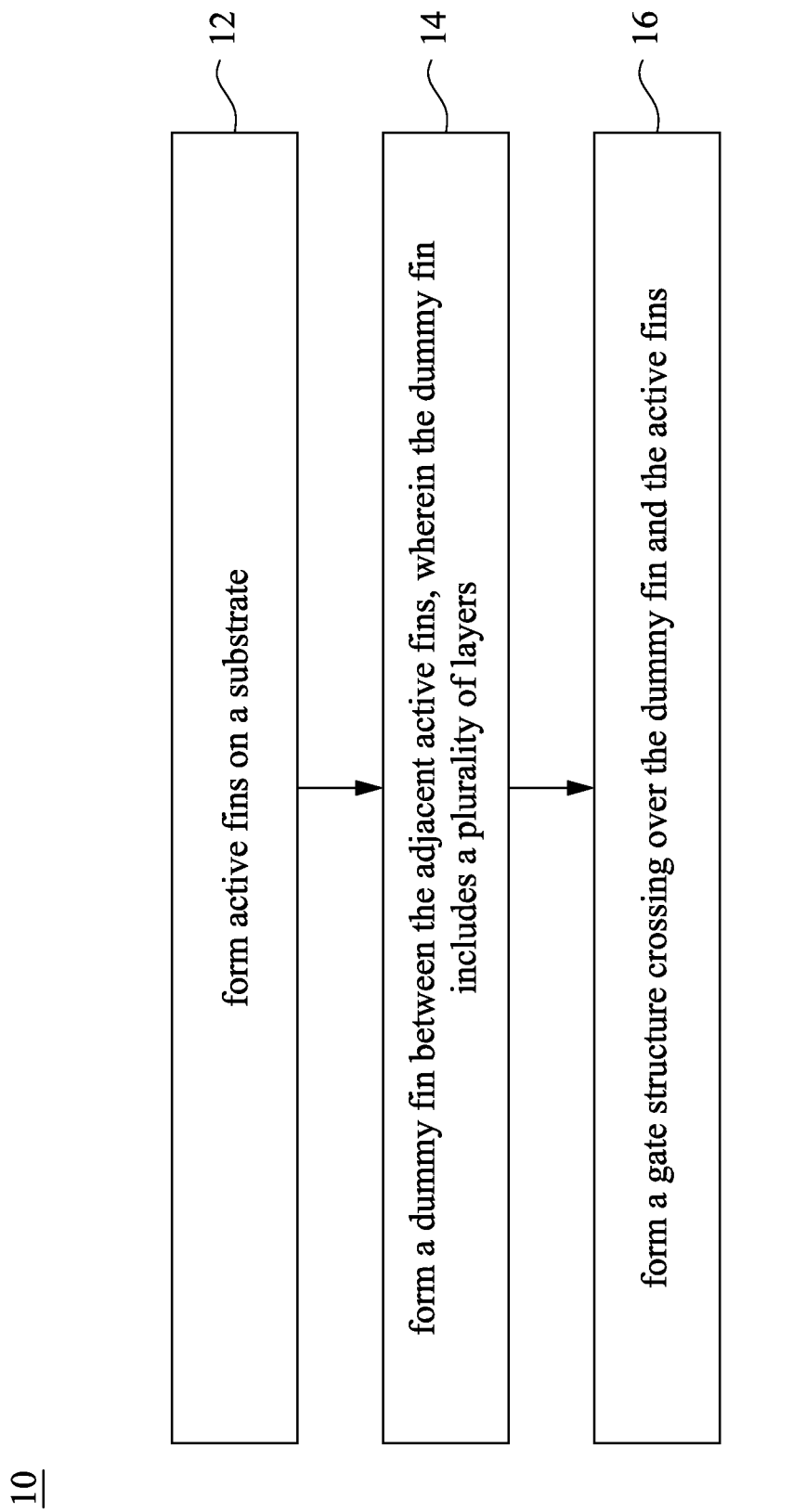
FIG. 1 is a flowchart illustrating a method of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method of manufacturing a semiconductor device according to various embodiments of the present disclosure. As illustrated in FIG. 1, the method 10 includes at least operations 12, 14, and 16. FIGS. 2A-10B are drawings schematically illustrating various stages of the method 10 in FIG. 1 according to various embodiments. In FIGS. 2A-10B, figures ending with an "A" designation are illustrated a perspective view, and figures ending with a "B" designation are illustrated along a similar cross-section B-B'. It will be appreciated that although the methods disclosed herein each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Referring to FIG. 1 and FIG. 2A-2B, the method 10 begins at the operation 12 by forming active fins 110 on a substrate 100. The active fins 110, for example, may include a first active fin 112, a second active fin 114, a third active fin 116, and a fourth active fin 118, as depicted in FIG. 2A-2B. In various embodiments, the substrate 100, for example, may be a bulk semiconductor, a semiconductor-on-insulator (SOI) substrate, or the like, which may be doped (e.g., with a p-type or an n-type dopant) or undoped. In some embodiments, the substrate 100 may include silicon (Si), germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As illustrated in FIG. 2A-2B, the first, second, third, and fourth active fins 112, 114, 116, and 118 extend along an X direction in parallel. In various embodiments, the active fins 110 may include one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In some embodiments, the active fins 110 may be formed by epitaxially growing one or more semiconductor layers over the substrate 100 and then be patterned by any suitable method. In various embodiments, the active fins 110 may have a height H1 of about 45-70 nm, such as 46, 47, 48, 49, 50, 51, 52, 53, 54, 55, 56, 57, 58, 59, 60, 61, 62, 63, 64, 65, 66, 67, 68, or 69 nm. In various embodiments, the active fins 110 may have a width W1 of about 3-9 nm, such as 4, 5, 6, 7, or 8 nm. In some embodiments, the pitch between two adjacent active fins 110 may be different. For example, the pitch P3 between the third active fin 116 and the fourth active fin 118 may be greater than the pitch P1 between the first active fin 112 and the second active fin 114. The pitch P1, P2, and P3 shown in FIGS. 2A and 2B are merely examples and are not intended to be limiting the present disclosure. In yet some embodiments, for example, a pitch between two adjacent active fins 110 may be equal.

The fins (such as the active fins 110) may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Referring back to FIG. 1, the method 10 proceeds to the operation 14 by forming a dummy fin 210 between the adjacent active fins 110. FIGS. 3A-9B are drawings illustrating perspective and cross-sectional views of various stages of the operation 14, according to some embodiments of the present disclosure.

Reference is made to FIGS. 3A and 3B. A first dielectric layer 120 may be conformally formed over the substrate 100, the first, the second, the third and the fourth active fins 112, 114, 116, 118. In various embodiments, the first dielectric layer 120 may include silicon nitride, silicon oxide, silicon oxynitride, a polymer dielectric, combinations thereof, or the like. The formation of the first dielectric layer 120 may include any suitable deposition method, such as, plasma-enhanced atomic layer deposition (PEALD), chemical vapor deposition (CVD), plasma-enhanced chemical vapor deposition (PECVD), physical vapor deposition (PVD), and the like.

Figure 4B:
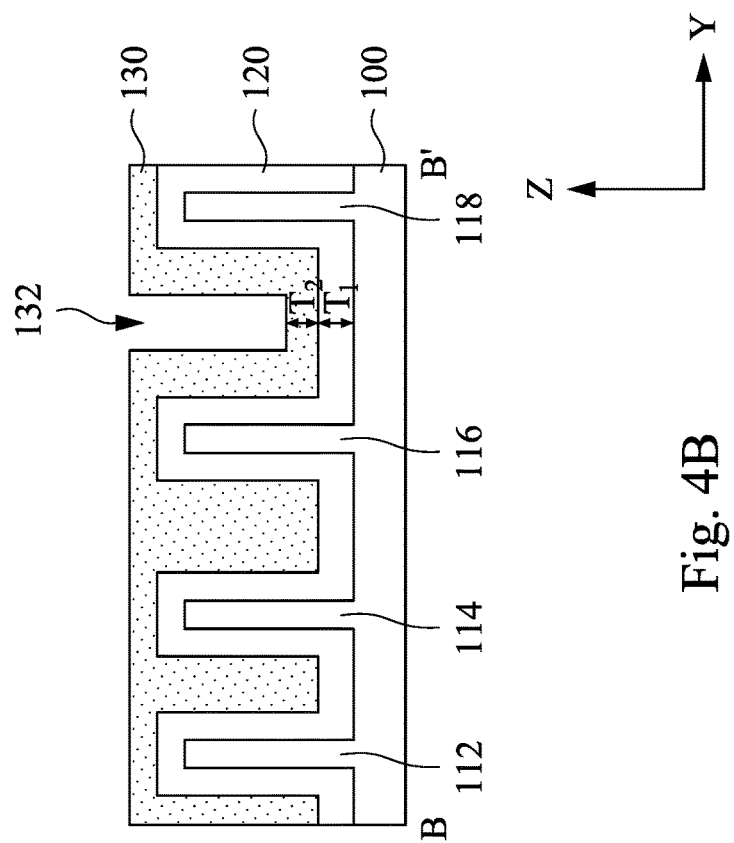
Figure 4A:
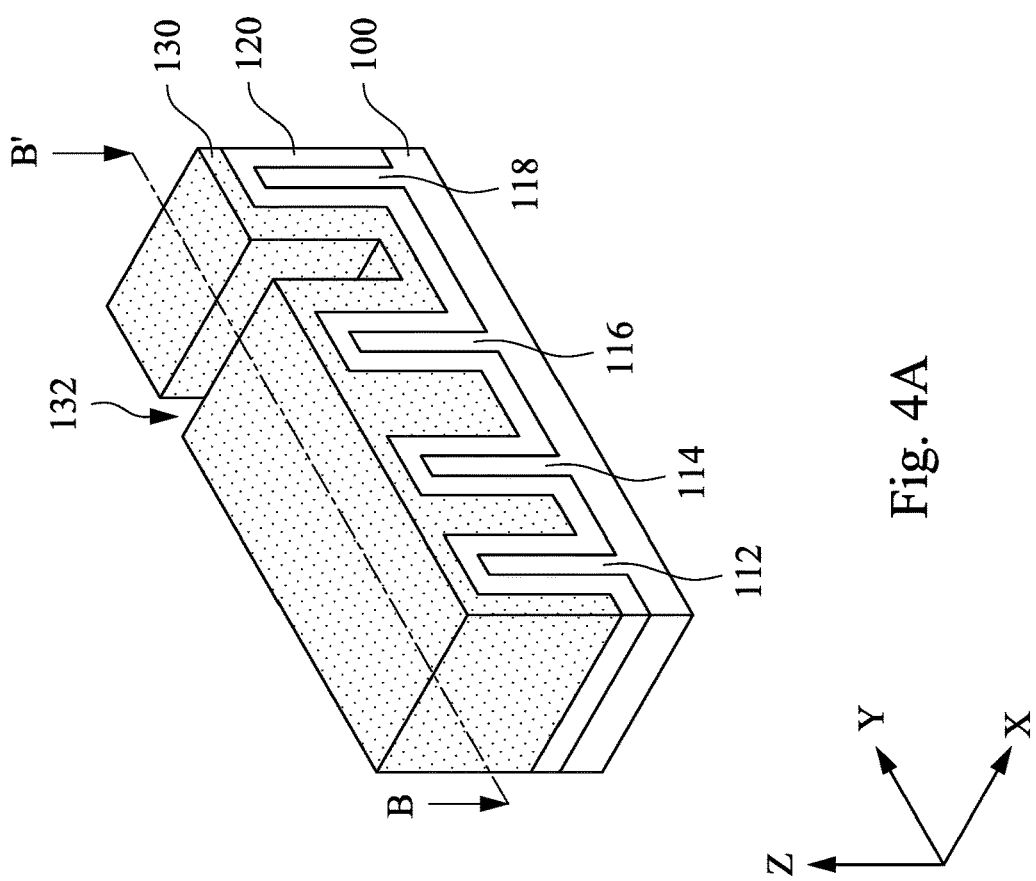

Referring now to FIGS. 4A-4B. A second dielectric layer 130 may be blanket formed over the first dielectric layer 120. In various embodiments, the second dielectric layer 130 may include Si, Ge, SiGe, oxide, nitride, oxy-nitride, $HfO_2$, $ZrO_2$, $Al_2O_3$, combinations thereof, or the like. In some embodiments, the material of the second dielectric layer 130 may be the same as the first dielectric layer 120. In other embodiments, the material of the second dielectric layer 130 may be different from the first dielectric layer 120. The formation of the second dielectric layer 130 may include any suitable deposition methods. For example, the second dielectric layer 130 may be formed by using the same or similar method as forming the first dielectric layer 120. In some embodiments, as shown in FIG. 4A, the second dielectric layer 130 may have a notch 132 between the third active fin 116 and the fourth active fin 118 because of the pitch P3 (shown in FIG. 2B) is greater than the sum of the thickness T1 of the first dielectric layer 120 and thickness T2 of the second dielectric layer 130.

Figure 5B:
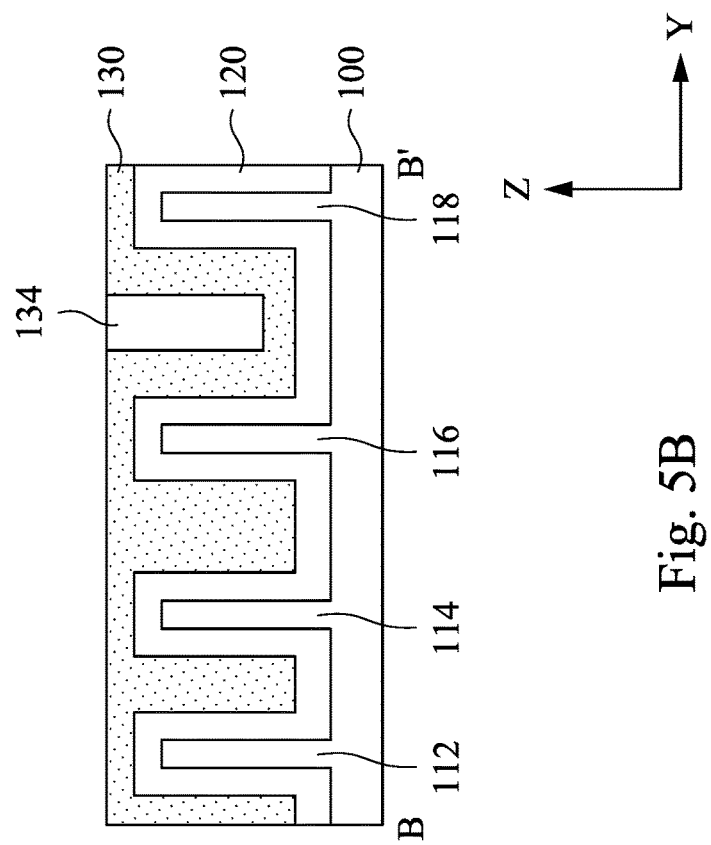
Figure 5A:
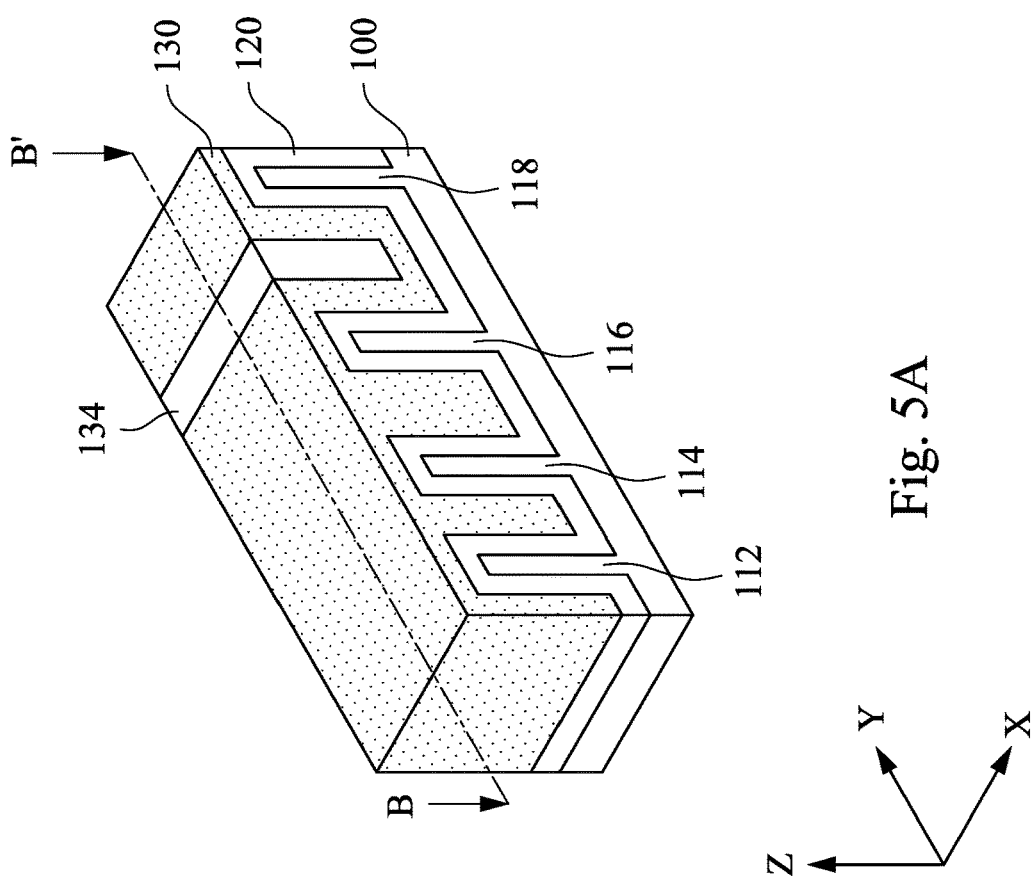

Reference is made to FIGS. 5A-5B. A flowable oxide material 134 may be deposited in the notch 132. The flowable oxide material 134 fills the notch 132, and is substantially even with the top surface of the second dielectric layer 130. In various embodiments, the flowable oxide material 134 may include any suitable materials that have low dielectric constant. The flowable oxide material 134 may deposited by any suitable deposition method. In some embodiments, an annealing process may further be performed after depositing the flowable oxide material 134 in the notch 132. In some embodiments, a chemical mechanical planarization (CMP) process may be performed after the flowable oxide material 134 is deposited in the notch 132.

Referring to FIGS. 6A-6B, the second dielectric layer 130 may be etched to form one or more trenches 136 (such as trench 136a, 136b, 136c, 136d) between the adjacent active fins 110. The trenches 136 expose a top portion of the first dielectric layer 120 over the active fins 110. The second dielectric layer 130 may be etched by dry etching, wet etching, and/or other suitable etching methods. After the etching process, the remaining second dielectric layer 130 is positioned between the adjacent active fins 110. The trenches 136 have a depth H2, and may be used for forming other dielectric layers in the subsequent processes. In some embodiments, the second dielectric layer 130 and the flowable oxide material 134 between the third active fin 116 and the fourth active fin 118 are etched to form a trench 136d, as shown in FIGS. 6A-6B.

Figure 7B:
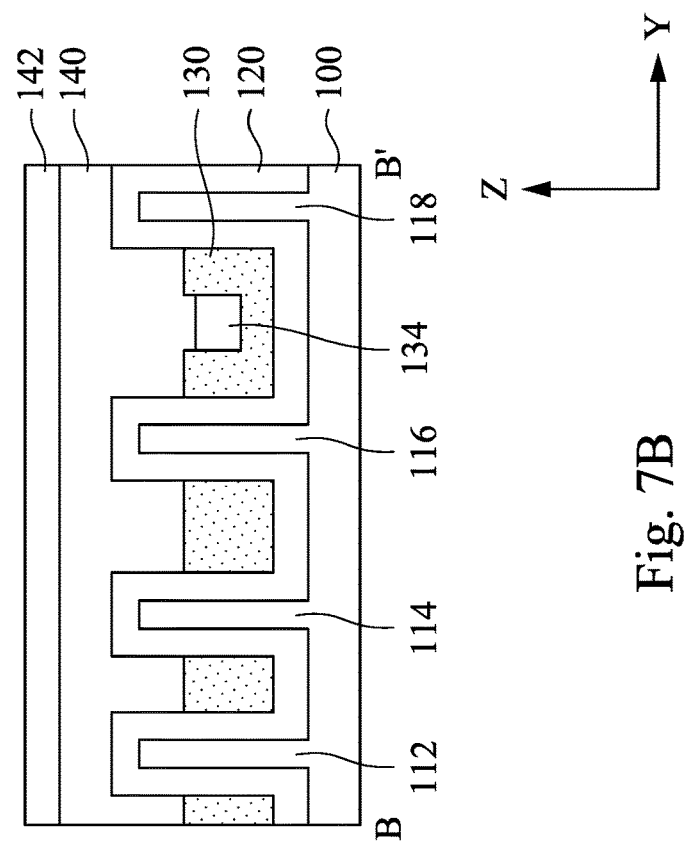
Figure 7A:
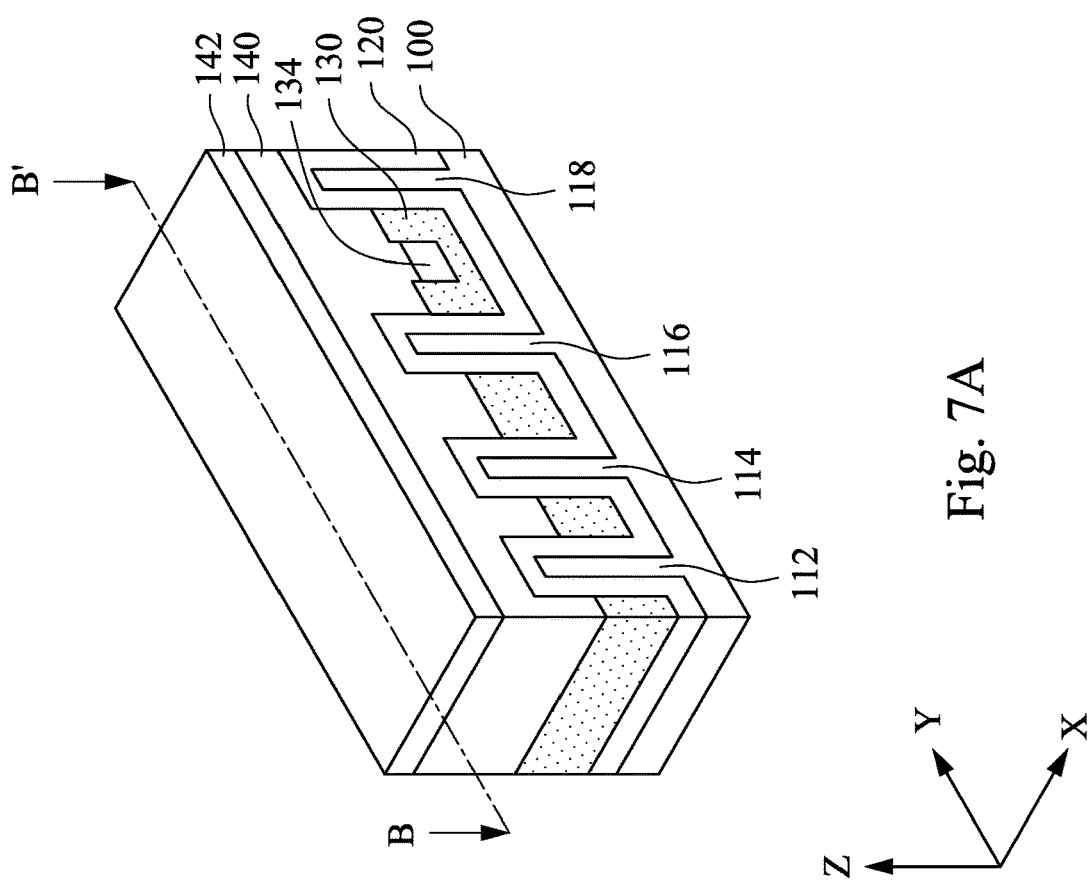

Reference is made to FIGS. 7A-7B. A third dielectric layer 140 may be formed over the substrate 100 filling the trenches 136 and covering the top portion of the first dielectric layer 120. In various embodiments, the third dielectric layer 140 may include Si, Ge, SiGe, oxide, nitride, oxy-nitride, $HfO_2$, $ZrO_2$, $Al_2O_3$, combinations thereof, or the like. The material of the third dielectric layer 140 may be different from the second dielectric layer 130. In some embodiments, the third dielectric layer 140 may include a dielectric material having a dielectric constant greater than that of the second dielectric layer 130. In some examples, the third dielectric layer 140 may be $ZrO_2$, and the second dielectric layer 130 may be silicon. In other examples, the third dielectric layer 140 may be $HfO_2$, and the second dielectric layer 130 may be Si. In some embodiments, a plasma enhanced oxide (PEOX) layer 142 may further be formed on the third dielectric layer 140. In other embodiments, one or more dielectric layers may be optionally formed on the third dielectric layer 140.

Figures 8A, 8B:
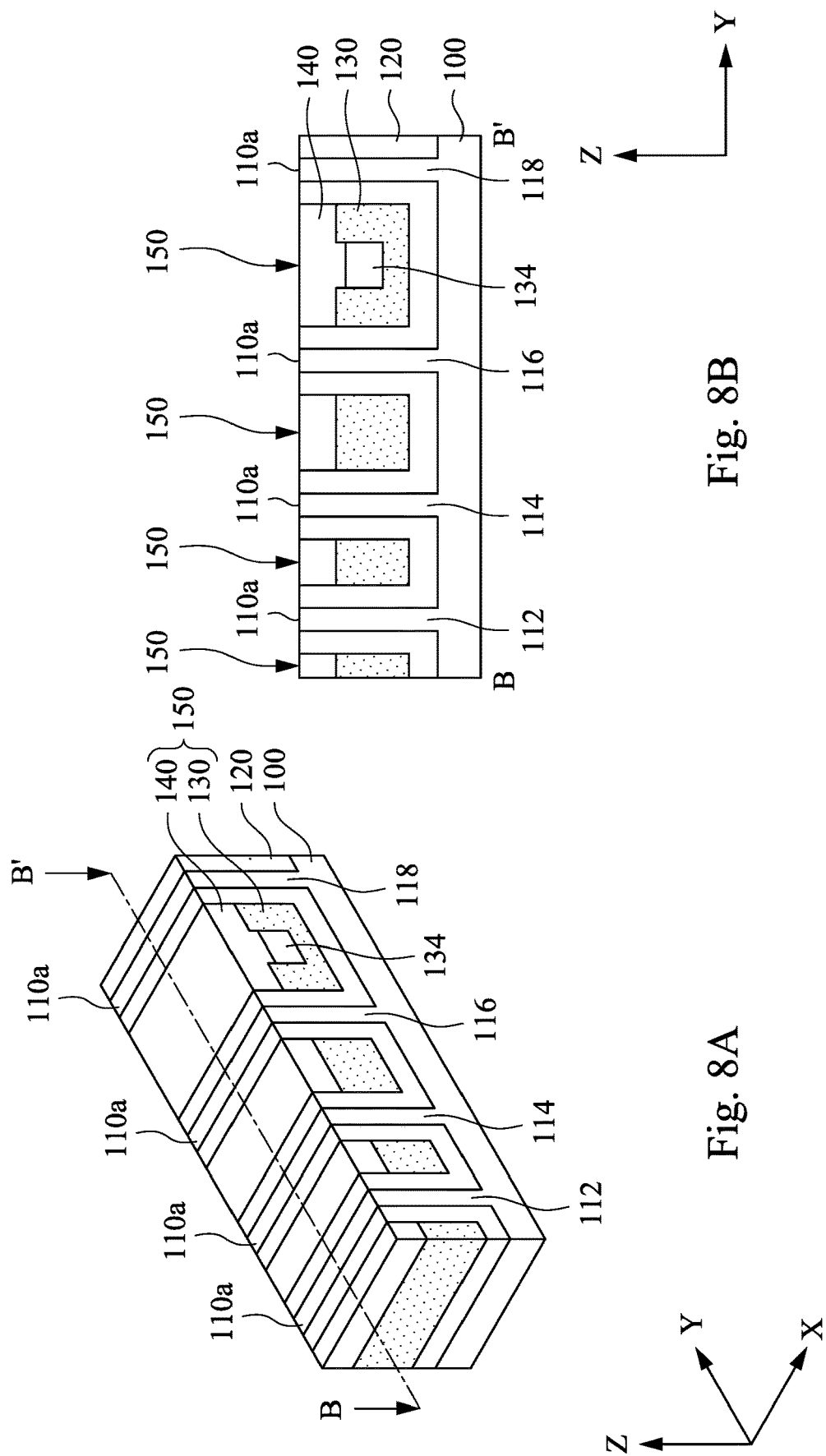

Reference is made to FIGS. 8A-8B. A planarization process may be performed to expose top surfaces 110a. The planarization process may include any suitable planarization method such as chemical mechanical planarization (CMP) process or the like. After the planarization process, dielectric layer stacks 150 including the second dielectric layer 130 and the third dielectric layer 140 may be formed. As shown in FIGS. 8A-8B the dielectric layer stacks 150 and the active fins 110 may be separated by the first dielectric layer 120.

Figures 9A, 9B:
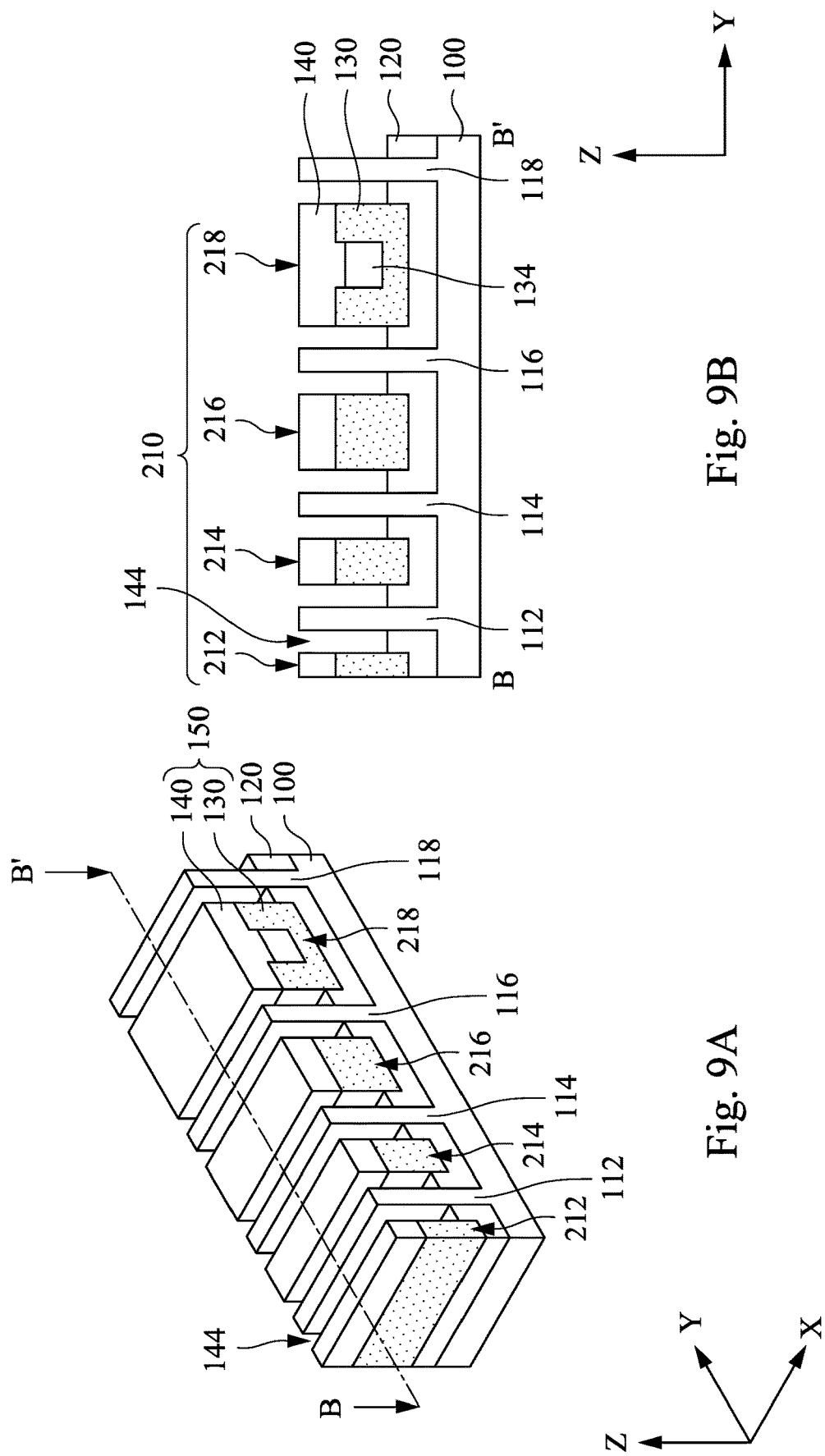

Reference is made to FIGS. 9A-9B. A portion of the first dielectric layer 120 between the dielectric layer stack 150 and the active fins 110 are etched to form one or more dummy fins 210 (such as dummy fins 212, 214, 216, and 218). For example, the portion of the first dielectric layer 120 between the dielectric layer stacks 150 and the active fins 110 are etched to form ditches 144. The formed dummy fins 210 stand on the remained portion of the first dielectric layer 120. In some embodiments, each of the dummy fins 210 includes at least two dielectric materials. For example, as shown in FIG. 9B, each of the dummy fins 212, 214, 216 includes a portion of the second dielectric layer 130 and a portion of the third dielectric layer 140. In some examples, the dummy fins 210 may further include other dielectric material. For example, the dummy fin 218 further includes the flowable oxide material 134. In other examples, each of the dummy fins 210 may further include additional dielectrics on the third dielectric layer 140. The dummy fins 210 may extend along the X direction and parallel with the active fins 110 according to some embodiments.

Referring back to FIG. 1, the method 10 proceeds to the operation 16 by forming a gate structure 160 crossing over the dummy fins 210 and the active fins 110, as illustrated in FIGS. 10A and 10B. For example, the gate structure 160 crosses over the dummy fins 212, 214, 216, 218 and the first, second, third and fourth active fins 112, 114, 116, 118. As illustrated in FIGS. 10A-10B, the gate structure 160 extends along the Y direction which is different from the X direction. The gate structure 160 overlaps portions of the dummy fins 210 and portions of the active fins 110. In various embodiments, the gate structure 160 may include a gate electrode 162 and a gate dielectric layer 164. In some embodiments, the gate electrode 162 may include one or more metal layers, such as work function metal layer(s), conductive barrier layer(s), and metal fill layer(s). The work function metal layer may be a p-type or an n-type work function layer depending on the type (PFET or NFET) of the device. The p-type work function layer includes a metal selected from but not restricted to the group of titanium nitride (TiN), tantalum nitride (TaN), ruthenium (Ru), molybdenum (Mo), tungsten (W), platinum (Pt), or combinations thereof. The n-type work function layer includes a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. In some embodiments, the gate dielectric layer 164 may include one or more dielectric materials. In some examples, the gate dielectric layer 164 may include high-k dielectric material, silicon nitride, silicon oxide, silicon oxynitride, or the combination thereof, or the like. In some embodiments, a gate spacer 166 may be optionally formed on opposite sides of the gate structure 160, as illustrated in FIGS. 10A and 10B.

After the operation 16, the method 10 may optionally include other operations or steps. FIGS. 11A-17B are drawings schematically illustrating various stages after the operation 16 according to some embodiments of the present disclosure. In FIGS. 10A-17B, figures ending with an "A" designation are illustrated a perspective view, figures ending with a "B" designation are illustrated along a similar cross-section B-B'. Referring to FIG. 11A, first fin sidewalls 170 may be further formed on the opposite side of the dummy fins 210, and second fin sidewalls 172 may be further formed on opposite side of the active fins 110. In various embodiments, the first and the second fin sidewall 172 may include any suitable dielectric materials. In some embodiments, the first fin sidewall 170 and the second fin sidewall 172 may have different height. In other embodiments, the first fin sidewall 170 may have a height equal to the second fin sidewall 172. In some embodiments, the formation of the first and the second fin sidewall 172 may include any suitable depositing methods.

Reference is made to FIGS. 12A-12B. The portions of the active fins 110 exposed out of the gate structure 160 are partially removed to form recesses 174. In other words, the active fins 110 are recessed to form the recesses 174. The removing process may include a dry etching process, a wet etching process, and/or combination thereof. In some embodiments, the second fin sidewall 172 has a top higher than a top of the remained active fins 110. In some examples, the top of the second fin sidewall 172 may be at least 5 nm higher than the top of the recess active fins 110.

Figures 13A, 13B:
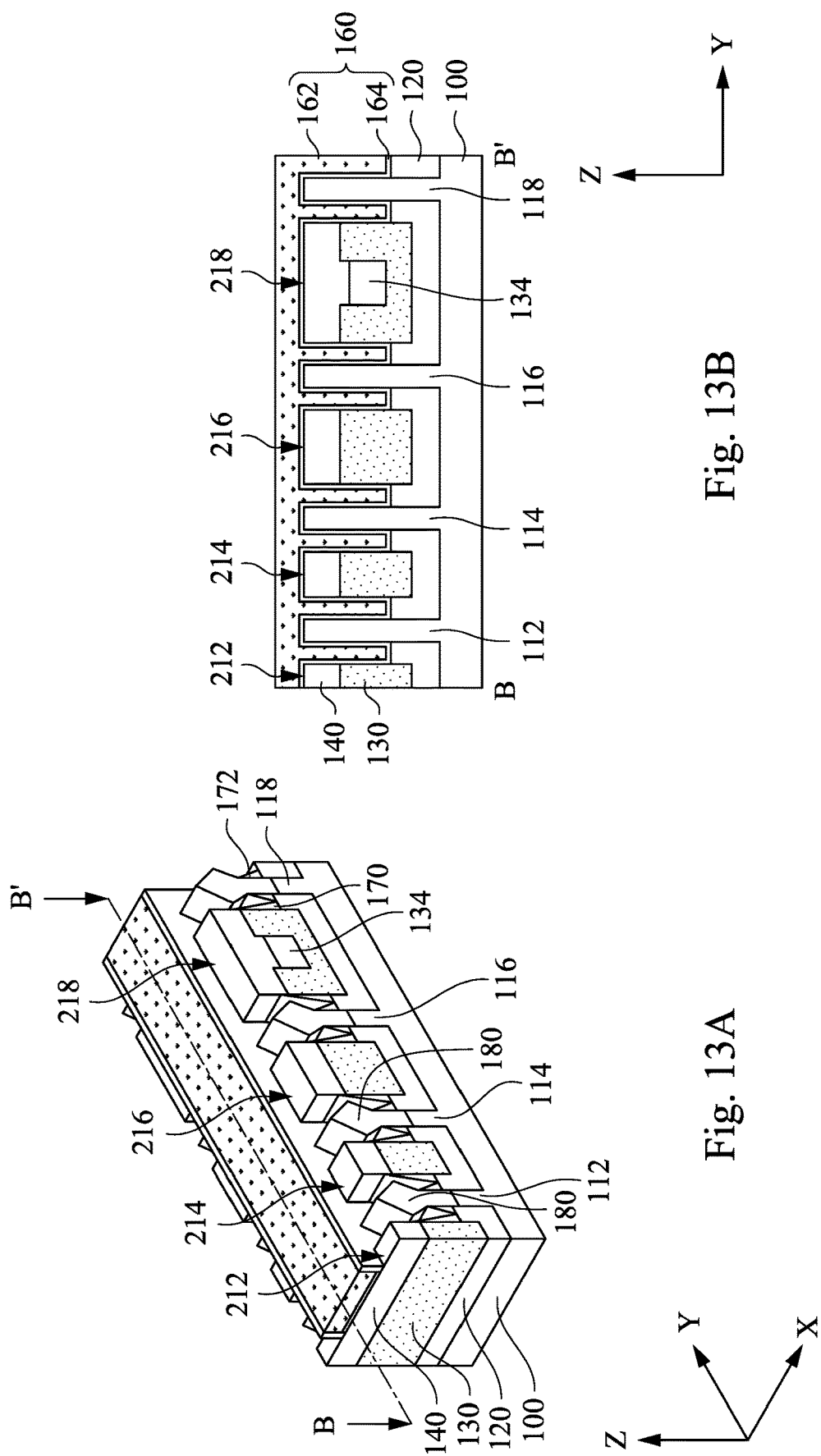

Referring now to FIGS. 13A-13B. Epitaxial source/drain (S/D) features 180 may be formed on the remained active fins 110 according to some embodiments of the present disclosure. The epitaxial source/drain (S/D) features 180 are formed from the remained active fins 110 in the recesses 174. In some embodiments, the tops of the epitaxial S/D features 180 may be higher than the tops of the dummy fins 210. Adjacent epitaxial S/D features 180 are separated by one of the dummy fins 210. For example, the S/D feature 180 on the first active fin 112 and the S/D feature 180 on the second active fin 114 are separated by the dummy fin 214. In various embodiments, the epitaxial S/D features 180 may include semiconductor materials such as Ge or Si; or compound semiconductor materials, such as GaAs, AlGaAs; or semiconductor alloy, such as SiGe, GaAsP. In some embodiments, the epitaxial S/D features 180 may be n-type epitaxial S/D features 180, such as SiCP, SiP, SiAs, or combinations thereof. In other embodiments, the epitaxial S/D features 180 may be p-type epitaxial S/D features 180, such as SiGe, SiGeB, or combinations thereof. The epitaxial S/D features 180 may be formed using one or more epitaxy or epitaxial processes. In some embodiments, the epitaxy processes include CVD deposition techniques, molecular beam epitaxy, and/or other suitable process.

Figures 14A, 14B:
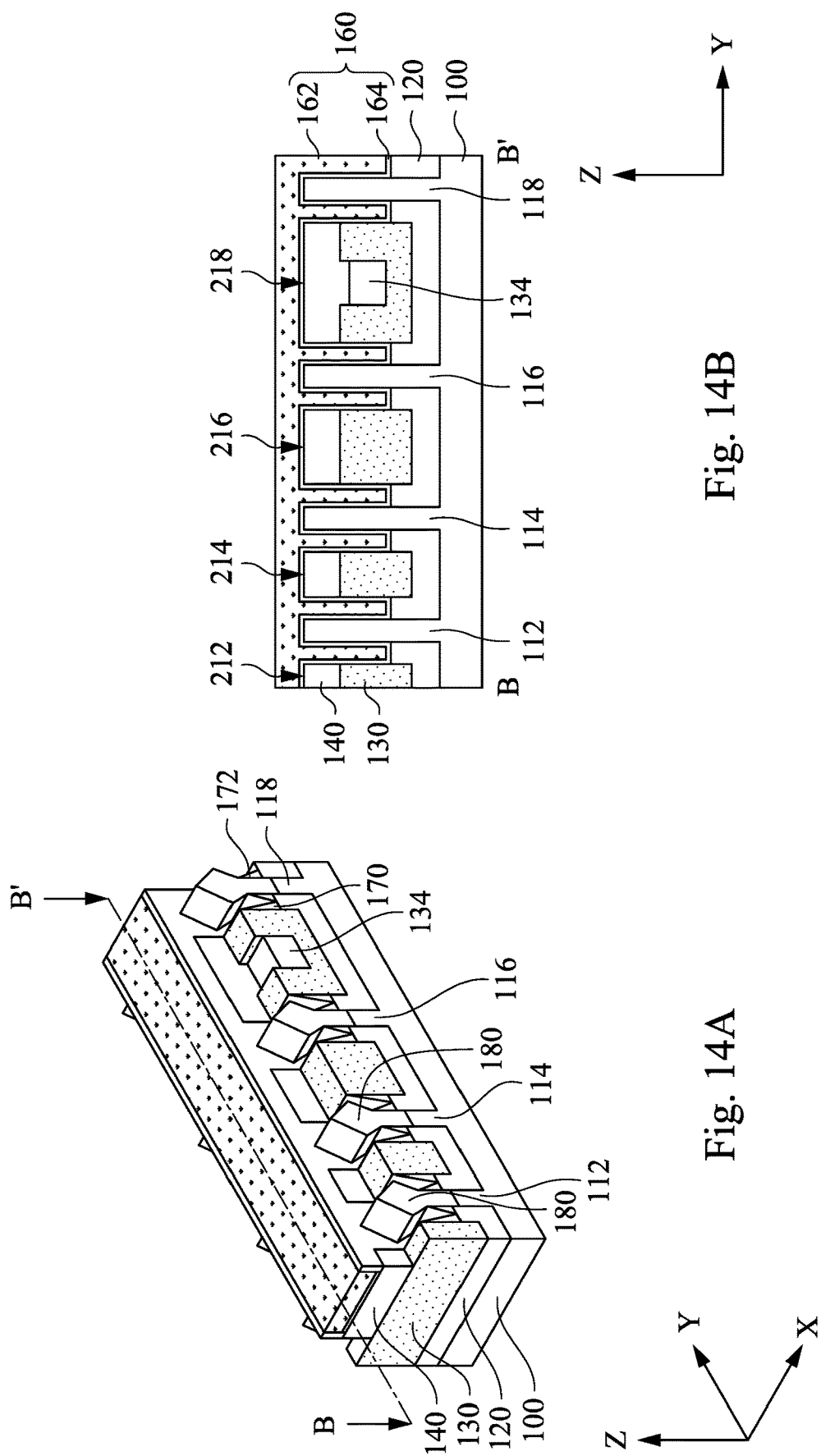

Reference is made to FIGS. 14A and 14B. In some embodiments, a portion of each dummy fin 210 may optionally be removed. For example, the third dielectric layer 140, which is not covered by the gate structure, of the dummy fins 210 may be removed, as shown in FIG. 14A. Removing the dielectric layer with a higher dielectric constant may reduce the AC penalty of the semiconductor device. In some embodiments, a portion of the first fin sidewall 170 may also be removed.

Reference is made to FIGS. 15A-15B. In some embodiments, an interlayer dielectric (ILD) layer 190 may be formed over the substrate 100, and covers the active fins 112, 114, 116, 118, the dummy fins 212, 214, 216, 218 and the epitaxial S/D features 180. In various embodiments, the ILD layer 190 may include silicon oxide, silicon nitride, silicon oxynitride, tetraethoxysilane (TEOS), phosphosilicate glass (PSG), borophosphosilicate glass (BPSG), low-k dielectric material such as fluorinated silica glass (FSG), and/or other suitable dielectric materials. The ILD layer 190 may be formed by using the CVD, FCVD, ALD, or other suitable methods. In some embodiments, a replacement gate process where it first forms dummy gate structure and then replaces the dummy gate structure with the gate structure may be further performed after forming the ILD layer 190.

Reference is made to FIGS. 16A-16B. In some embodiments, a portion of the gate structure 160 may be etched away to form an opening 168 exposing at least one of the dummy fins 210. For example, as shown in FIGS. 16A-16B, portions of the gate electrode 162 and the underlying gate dielectric layer 164 are etched to form an opening 168, and the gate structure 160 is then divided into a first gate structure 160a and a second gate structure 160b. In various embodiments, a depth of the opening 168 may be controlled by the etching selectivity of the dielectric layers. In some embodiments, the etching process may stop when the third dielectric layer 140 of the dummy fins 210 is exposed. In other embodiments, the etching process may further remove a portion of each dummy fin 210. Although FIG. 16B shows that the third dielectric layer 140 of the dummy fins 210 are not etched, the etching process may further remove at least a portion of the third dielectric layer 140 which is previously covered by gate structure 160. Similarly, although FIG. 16B shows that second dielectric layer 130 of dummy fins 210 are not etched, the etching process may further remove a portion of the second dielectric layer 130 of each dummy fin 210. In other embodiments, a plurality of openings 168 may be formed to expose a plurality of the dummy fins 210.

Figures 17A, 17B:
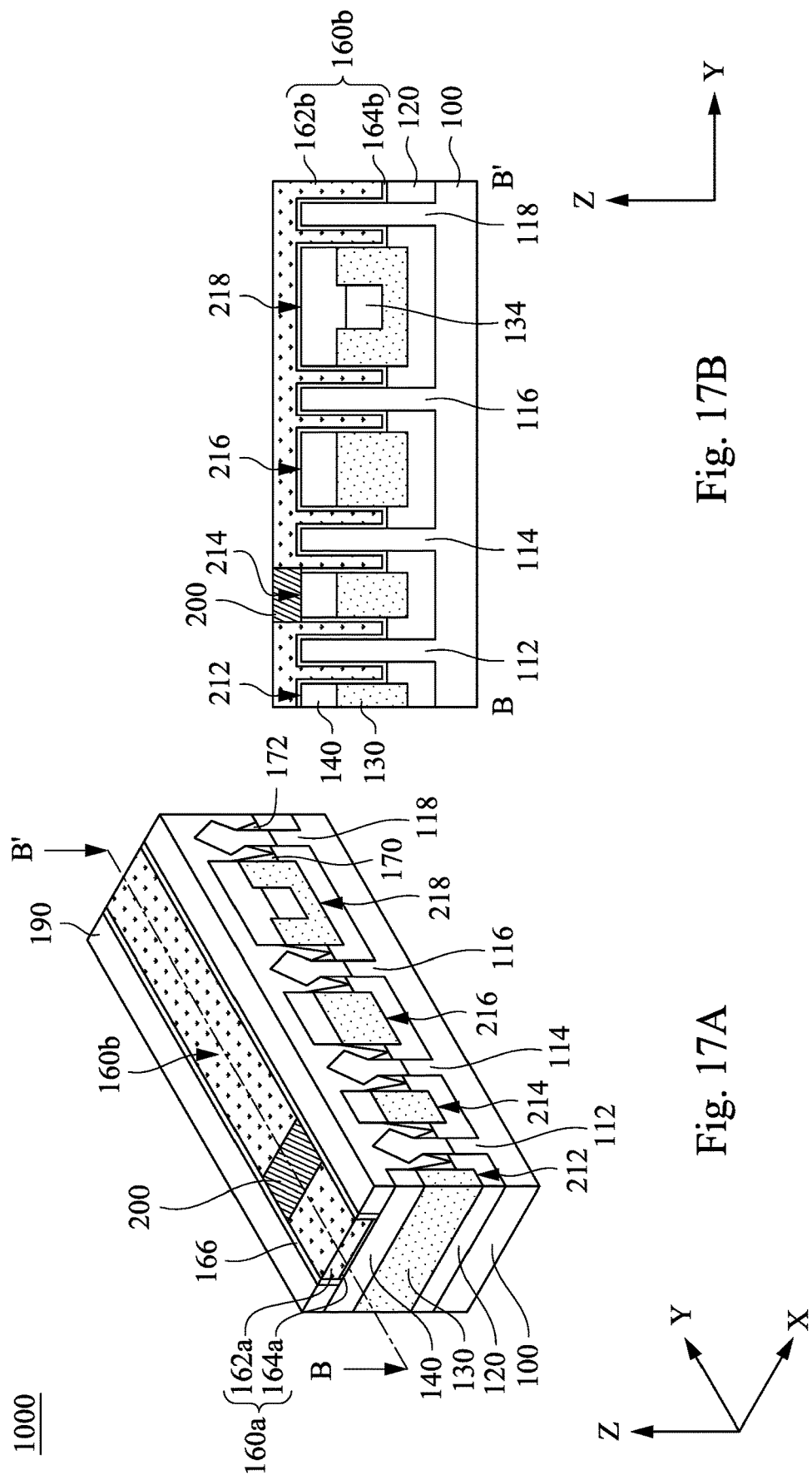

Reference is made to FIGS. 17A and 17B, an isolation structure 200 may be formed in the opening 168. The isolation structure 200 is formed on the third dielectric layer 140 of the dummy fin 214. The location and the shape of the isolation structure 200 depend on that of the opening 168 to be filled. In various embodiments, the isolation structure 200 may include silicon oxide, silicon nitride, silicon oxynitride, silicon oxycarbonitride, hafnium silicon oxide, zirconium silicon oxide, aluminum silicon oxide, a combination of thereof, and/or other suitable material. In some embodiments, the isolation structure 200 may include one or more insulating materials. The isolation structure 600 may be formed by CVD, PVD, ALD, or other suitable deposition method, and optionally followed by a chemical mechanical polishing process.

Figures 17C, 17D:
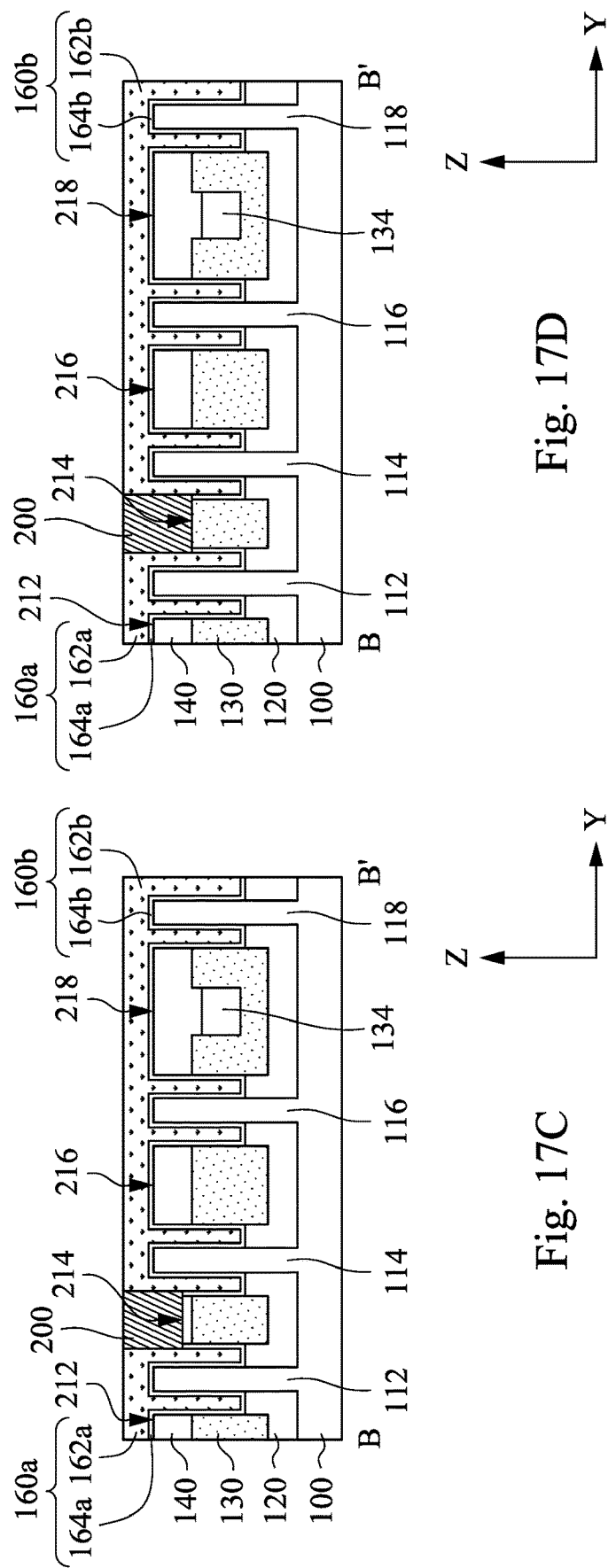
Figure 17E:
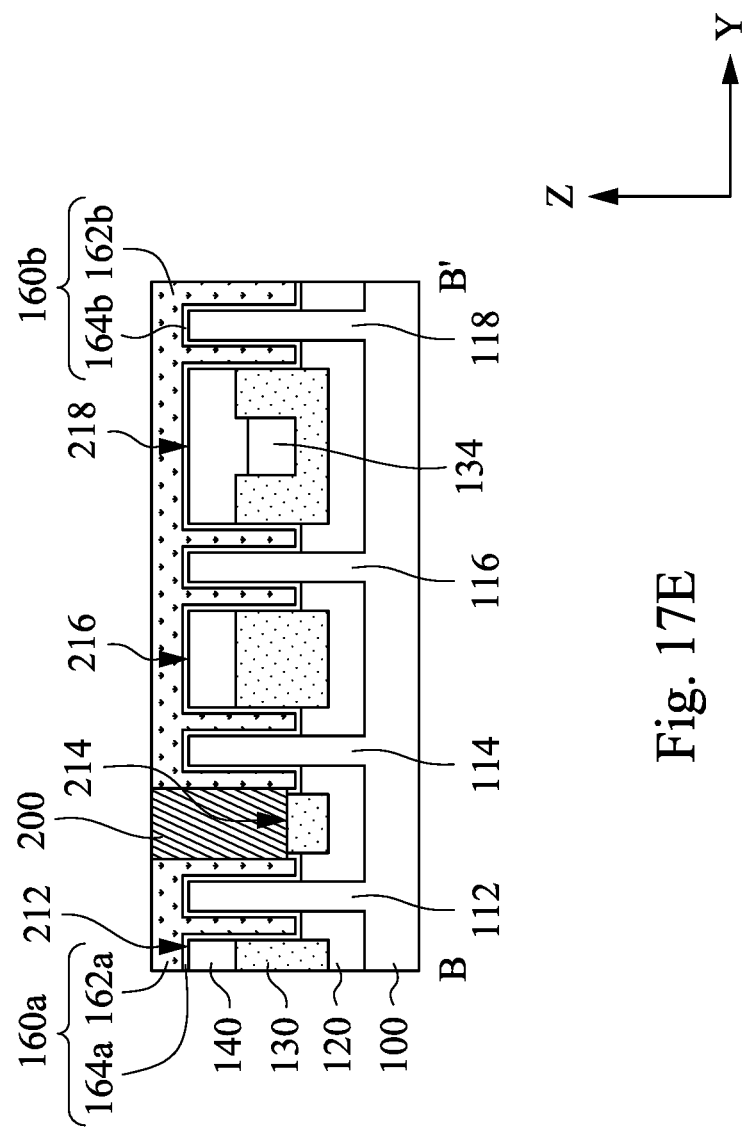

FIGS. 17C-17E are cross-sectional views taken along line B-B' in FIG. 17A in accordance with yet some embodiments of the present disclosure. Reference is made to FIG. 17C, a portion of the third dielectric layer 140 may be etched during the formation of the opening 168, and the isolation structure 200 is then formed on the remaining third dielectric layer 140. As depicted in FIG. 17D, during the formation of the opening 168, the underlying third dielectric layer 140 is completely removed, and the isolation structure 200 may be form on the second dielectric layer 130. In yet other embodiments, as shown in FIG. 17E, a portion of the second dielectric layer 130 may further be removed, and the isolation structure 200 may be formed on the remaining second dielectric layer 130.

It will be appreciated that although the methods disclosed herein each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

According to another aspect of the present disclosure, a semiconductor device 1000 is provided, as illustrated in FIGS. 17A-17B. The semiconductor device 1000 may include the substrate 100, the first active fin 112, the second active fin 114, the dummy fin 214, the first gate structure 160a and the second gate structure 160b. The various materials for the substrate 100, the first active fin 112, the second active fin 114, the dummy fin 214 and the first and second gate structure 160a and 160b of the semiconductor device 1000 have been discussed above. The semiconductor device 1000 may optionally include other elements, which are described hereinafter.

The first and second active fins 112, 114 are formed on the substrate 100 and extend along the X direction. In some embodiments, the semiconductor device 1000 may further include the third active fin 116 and the fourth active fin 118. As shown in FIG. 17A, each of the first and second active fins 112, 114 includes an epitaxial source/drain (S/D) feature 180 respectively. The semiconductor device 1000 may optionally include the second fin sidewalls 172 on opposite side surfaces of the first and second active fins 112, 114.

The dummy fin 214 is disposed between the first and second active fins 112, 114, and separates the adjacent epitaxial source/drain (S/D) features 180 thereon. In some embodiments, the semiconductor device 1000 may further include dummy fin 216, 218 between the adjacent active fins. In various embodiments, the dummy fin 214 includes a plurality of layers, and each of the layers includes a material different from another one of the layers. For example, as shown in FIG. 17B, the second dielectric layer 130 and the third dielectric layer 140 of the dummy fin 214 include materials different from each other. Although FIGS. 17A-17B only show that two dielectric layers (i.e., the second dielectric layer 130 and the third dielectric layer 140) are included in the dummy fin 214, it should be understood that the present disclosure is not limited thereto. The dummy fin 214 may have any numbers of the dielectric layers, depending on needed. In some embodiments, the semiconductor device 1000 may include the first dielectric layer 120 between the dummy fin 214 and the substrate 100. In other embodiments, the semiconductor device 1000 may optionally include the first fin sidewall 170 on opposite side surfaces of the dummy fin 214.

In some embodiments, the first gate structure 160a and the second gate structure 160b are aligned in the Y direction. As depicted in FIG. 17B, the first gate structure 160a may cross over the dummy fin 212 and the first active fin 112, and the second gate structure 160b may cross over the dummy fins 216, 218 and the second, the third and the fourth active fins 114, 116, 118.

The semiconductor device 1000 may further include the isolation structure 200 in some embodiments. As shown in FIG. 17B, the isolation structure 200 is over the dummy fin 214 and separates the first gate structure 160a from the second gate structure 160b. More specifically, the isolation structure 200 and the dummy fin 214 collectively separate and isolate the first gate structure 160a and the second gate structure 160b.

Figures 18A, 18B:
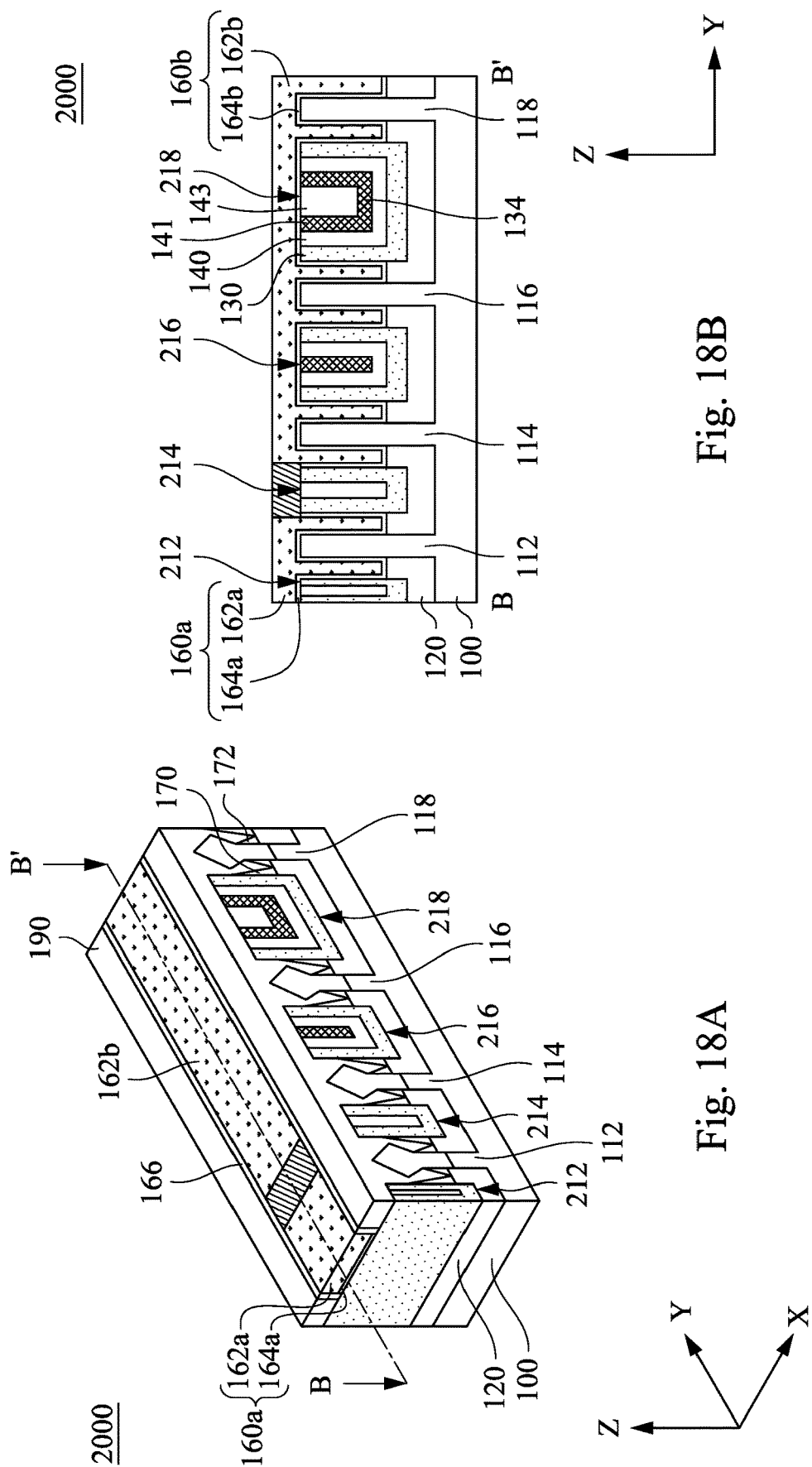

Reference is made to FIGS. 18A-18B, illustrating a perspective view and a cross-sectional view of a semiconductor device 2000 in accordance with other aspects of the present disclosure. The difference between the semiconductor device 1000 show in FIG. 17A and the semiconductor device 2000 shown in FIG. 18A is the configuration of the dummy fins 212, 214, 216, 218. As shown in FIG. 18A, in some embodiments, the dummy fin 214 includes the dielectric layer 140 (i.e., the inner layer) which is partially wrapped in the dielectric layer 130 (i.e., the outer layer), and the tops of the dielectric layers 130 and 140 are substantially even. In other embodiments, the dielectric layer 140 (i.e., the inner layer) may be completely wrapped in the dielectric layer 130 (i.e., the outer layer). It should be understood that the dummy fins 212, 214, 216, 218 shown in FIGS. 18A-18B are merely examples and are not intended to be limiting the present disclosure.

Embodiments of the present disclosure may have at least the advantages described below. The semiconductor device has a dummy fin with multiple layers, and each of the layers has a material different from another layer. The semiconductor device in the present disclosure may be advantageous to reduce the AC penalty, the height loss of dummy fin at FEOL, and improve the issue of S/D EPI merge. Moreover, it may be easy to control the depth of the gate structure to be cut during the formation of the isolation structure between the gate structures because of the dummy fin includes materials with different etching selectivity.

According to some embodiments, a semiconductor device includes a first active fin and a second active fin on a substrate, wherein the first active fin and the second active fin extend along a first direction, a dummy fin disposed between the first active fin and the second active fin wherein the dummy fin includes a plurality of layers, and each of the layers includes a material different from another one of the layers, and a first gate structure crossing over the dummy fin and the first and the second active fins.

According to some embodiments, the dummy fin includes Si, Ge, SiGe, oxide, nitride, oxy-nitride, $HfO_2$, $ZrO_2$, $Al_2O_3$, or a combination of thereof.

According to some embodiments, the devices further comprising a dielectric layer between the dummy fin and the substrate.

According to some embodiments, the dummy fin includes a top layer and a bottom layer, and the top layer has a dielectric constant that is greater than the bottom layer.

According to some embodiments, the dummy fin includes an inner layer and an outer layer, wherein the inner layer is wrapped in the outer layer.

According to some embodiments, the first and the second active fins include an epitaxial source/drain (S/D) feature respectively, wherein the epitaxial source/drain (S/D) features include SiCP, SiP, SiAs, or SiGeB.

According to some embodiments, the epitaxial source/drain (S/D) features of the first and the second active fins are separated from each other by the dummy fin.

According to some embodiments, the device further includes a second gate structure extending along a lengthwise direction of the first gate structure, and aligned with the first gate structure, and a gate isolation structure on the dummy fin and separating the first gate structure and the second gate structure.

According to some embodiments, the device further includes a dummy fin sidewall structure disposed on opposite side surfaces of the dummy fin and an active fin sidewall structure disposed on opposite side surfaces of the first and the second active fins.

According to some embodiments, a semiconductor device includes a dummy fin on a substrate, wherein the dummy fin includes at least two layers that have different material, a first active fin and a second active fin disposed on opposite side of the dummy fin on the substrate, and a gate structure extending along a direction perpendicular to a lengthwise direction of the first and the second active fins, and traversing the dummy fin, the first active fin and the second active fin.

According to some embodiments, each of the at least two layers of the dummy fin includes a dielectric material different from each other.

According to some embodiments, the dummy fin includes a top layer and a bottom layer, and the top layer has a dielectric constant that is greater than the bottom layer.

According to some embodiments, a method of manufacturing a semiconductor device includes forming a first active fin and a second active fin on a substrate, forming a dummy fin between the first and the second active fins, wherein the dummy fin includes a plurality of layers, and each of the layers includes a material different from another one of the layers, and forming a gate structure crossing over the dummy fin, the first active fin and the second active fin.

According to some embodiments, forming the dummy fin between the first and the second active fins includes forming a first dielectric layer overlaying the first active fin, the second active fin, and the substrate, forming a second dielectric layer over the first dielectric layer, selectively etching the second dielectric layer to form a trench between the first active fin and the second active fin, wherein the trench exposes a top portion of the first dielectric layer over the first and the second active fins, forming a third dielectric layer filling the trench and covering the top portion of the first dielectric layer, performing a planarization process to expose a top of the first active fin and the second active fin, and etching a portion of the first dielectric layer between the second dielectric layer and each of the first and the second active fins.

According to some embodiments, the method further includes depositing a flowable oxide material on the second dielectric layer before forming the third dielectric layer.

According to some embodiments, the method further includes etching away a portion of the gate structure overlapped with the dummy fin to form an opening exposing the dummy fin, and forming an isolation structure in the opening.

According to some embodiments, etching away the portion of the gate structure overlapped with the dummy fin includes removing a portion of the dummy fin.

According to some embodiments, removing the portion of the dummy fin includes removing a top layer of the dummy fin.

According to some embodiments, removing the portion of the dummy fin includes removing a portion of a bottom layer of the dummy fin.

According to some embodiments, the method further includes forming epitaxial source/drain (S/D) features on the first and the second active fins, and removing a portion of the dummy fin between the epitaxial source/drain (S/D) features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first active fin and a second active fin extending along a first direction;
   a dummy fin between the first active fin and the second active fin and comprising a first layer and a second layer, wherein the second layer of the dummy fin is over the first layer of the dummy fin, and the first layer and the second layer of the dummy fin comprise different materials; and
   a gate structure over the first active fin, the dummy fin, and the second active fin and extending along a second direction that is different from the first direction.

2. The semiconductor device of claim 1, wherein the first layer of the dummy fin is a dielectric layer.

3. The semiconductor device of claim 1, wherein the second layer of the dummy fin is a dielectric layer.

4. The semiconductor device of claim 1, further comprising:
   a first epitaxial source/drain feature over the first active fin; and
   a second epitaxial source/drain feature over the second active fin, wherein the dummy fin is between the first epitaxial source/drain feature and the second epitaxial source/drain feature.

5. The semiconductor device of the claim 1, further comprising:
   a dummy fin sidewall structure extending along sidewalls of the dummy fin.

6. The semiconductor device of the claim 1, further comprising:
an active fin sidewall structure extending along sidewalls of the first active fin.

7. The semiconductor device of the claim 1, further comprising:
a gate isolation structure in the gate structure and over the dummy fin.

8. The semiconductor device of the claim 7, wherein the gate isolation structure is in contact with a top of the dummy fin.

9. A semiconductor device comprising:
a first active fin and a second active fin on a substrate, wherein the first active fin and the second active fin extend along a first direction;
a dummy fin disposed between the first active fin and the second active fin, wherein the dummy fin comprises a first layer and a second layer over the first layer, and the first layer comprises a material different from a material of the second layer; and
a first gate structure crossing over the dummy fin and the first and the second active fins.

10. The semiconductor device of claim 9, wherein the dummy fin comprises Si, Ge, SiGe, oxide, nitride, oxynitride, $HfO_2$, $ZrO_2$, $Al_2O_3$, or a combination of thereof.

11. The semiconductor device of claim 9, further comprising a dielectric layer between the dummy fin and the substrate.

12. The semiconductor device of claim 9, wherein the second layer has a dielectric constant that is greater than the first layer.

13. The semiconductor device of claim 9, wherein the first layer is wrapped in the second layer.

14. The semiconductor device of claim 9, wherein the first and the second active fins comprise an epitaxial source/drain (S/D) feature respectively, wherein the epitaxial source/drain (S/D) features comprise SiCP, SiP, SiAs, or SiGeB.

15. The semiconductor device of claim 14, wherein the epitaxial source/drain (S/D) features of the first and the second active fins are separated from each other by the dummy fin.

16. The semiconductor device of claim 9, further comprising:
a second gate structure extending along a lengthwise direction of the first gate structure, and aligned with the first gate structure; and
a gate isolation structure on the dummy fin and separating the first gate structure and the second gate structure.

17. The semiconductor device of claim 9, further comprising:
a dummy fin sidewall structure disposed on opposite side surfaces of the dummy fin; and
an active fin sidewall structure disposed on opposite side surfaces of the first and the second active fins.

18. A semiconductor device comprising:
a dummy fin on a substrate, wherein the dummy fin comprises a first layer and a second layer over the first layer, and the first layer has a material different from a material of the second layer;
a first active fin and a second active fin disposed on opposite side of the dummy fin on the substrate; and
a gate structure on the substrate and extending across the dummy fin, the first active fin and the second active fin.

19. The semiconductor device of claim 18, wherein the first layer and the second layer are dielectric layers.

20. The semiconductor device of claim 18, wherein the second layer has a dielectric constant that is greater than the first layer.

* * * * *